(12) United States Patent
Tsutsumi et al.

(10) Patent No.: US 8,907,740 B2
(45) Date of Patent: Dec. 9, 2014

(54) DUPLEXER

(75) Inventors: Jun Tsutsumi, Tokyo (JP); Masafumi Iwaki, Tokyo (JP); Hiroshi Nakamura, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 516 days.

(21) Appl. No.: 13/291,269

(22) Filed: Nov. 8, 2011

(65) Prior Publication Data

US 2012/0126912 A1    May 24, 2012

(30) Foreign Application Priority Data

Nov. 18, 2010    (JP) ................................. 2010-258181

(51) Int. Cl.
| | |
|---|---|
| *H03H 9/00* | (2006.01) |
| *H03H 9/05* | (2006.01) |
| *H03H 9/70* | (2006.01) |
| *H03H 9/72* | (2006.01) |
| *H03H 9/10* | (2006.01) |

(52) U.S. Cl.
CPC .............. *H03H 9/0566* (2013.01); *H03H 9/706* (2013.01); *H03H 9/725* (2013.01); *H03H 9/0523* (2013.01); *H03H 9/0557* (2013.01); *H03H 9/059* (2013.01); *H03H 9/1014* (2013.01); *H03H 9/1071* (2013.01)
USPC .......................................... 333/133; 333/193

(58) Field of Classification Search
USPC .......................................... 333/133, 193–196
See application file for complete search history.

(56) References Cited

U.S. PATENT DOCUMENTS

| | | | |
|---|---|---|---|
| 7,298,321 B2 * | 11/2007 | King et al. ................ | 342/357.43 |
| 2005/0264375 A1 | 12/2005 | Ikuta et al. | |
| 2006/0044081 A1 | 3/2006 | Tanaka et al. | |
| 2006/0049896 A1 | 3/2006 | Onozawa | |
| 2006/0132260 A1 | 6/2006 | Iwamoto et al. | |
| 2006/0192462 A1 | 8/2006 | Iwamoto et al. | |
| 2011/0109400 A1 | 5/2011 | Koga et al. | |

FOREIGN PATENT DOCUMENTS

| | | |
|---|---|---|
| CN | 1702961 A | 11/2005 |
| CN | 1839543 A | 9/2006 |
| JP | 2006-66978 A | 3/2006 |
| JP | 2006-80921 A | 3/2006 |
| JP | 2006-180192 A | 7/2006 |
| WO | 2009/028683 A1 | 3/2009 |

OTHER PUBLICATIONS

Chinese Office Action dated Apr. 16, 2014, in a counterpart Chinese patent application No. 201110366224.0.

* cited by examiner

*Primary Examiner* — Robert Pascal
*Assistant Examiner* — Kimberly Glenn
(74) *Attorney, Agent, or Firm* — Chen Yoshimura LLP

(57) ABSTRACT

A duplexer includes: an insulation substrate having an upper surface on which a transmission filter and a reception filter are mounted, and a lower surface on which a foot pad layer electrically connected to the transmission filter and the reception filter is formed; a transmission pad provided on the upper surface and electrically connected to the transmission filter; a reception pad provided on the upper surface and electrically connected to the reception filter, a ring-shaped electrode provided on the upper surface and configured to surround the transmission pad and the reception pad; a ground foot pad included in the foot pad layer, and a via interconnection configured to electrically interconnect the ring-shaped electrode and the ground foot pad and to be provided in the ring-shaped electrode in a section along a shorter one of routes that connect the transmission pad and the reception pad to each other along the ring-shaped electrode.

16 Claims, 17 Drawing Sheets

DUPLEXER

CROSS-REFERENCE TO RELATED APPLICATION

This application is based upon and claims the benefit of priority of the prior Japanese Patent Application No. 2010-258181, filed on Nov. 18, 2010, the entire contents of which are incorporated herein by reference.

FIELD

A certain aspect of the present invention relates to duplexers.

BACKGROUND

Mobile communication terminals represented by cellular phones are widely used. In late years, a reduction in the size of the terminal is needed while the multiband of the terminal is advancing. For this reason, a reduction in the size of the duplexer employed in the terminal is also strongly needed. However, a reduced size of the duplexer may degrade the isolation between a transmission terminal and a reception terminal. Thus, the duplexer is required to reduce the size and improve the isolation.

Japanese Patent Application Publication No. 2006-180192 describes a technique where a ground pattern is provided for a partition between interconnections. Japanese Patent Application Publication Nos. 2006-80921 and 2006-66978 describe a technique where a surface acoustic wave (SAW) chip is mounted on an insulation substrate by flip-chip bonding and is sealed with a ring-shaped electrode formed on the insulation substrate.

The technique disclosed in Japanese Patent Application Publication No. 2006-180192 needs a large distance between the interconnection and the ground pattern. Thus, it may be difficult to obtain a sufficient isolation between the transmission terminal and the reception terminal. The ring-shaped electrode proposed in Japanese Patent Application Publication Nos. 2006-80921 and 2006-66978 may degrade the isolation.

SUMMARY OF THE INVENTION

According to an aspect of the present invention, there is provided a duplexer including: an insulation substrate having an upper surface on which a transmission filter and a reception filter are mounted, and a lower surface on which a foot pad layer electrically connected to the transmission filter and the reception filter is formed; a transmission pad provided on the upper surface and electrically connected to the transmission filter; a reception pad provided on the upper surface and electrically connected to the reception filter, a ring-shaped electrode provided on the upper surface and configured to surround the transmission pad and the reception pad; a ground foot pad included in the foot pad layer, and a via interconnection configured to electrically interconnect the ring-shaped electrode and the ground foot pad and to be provided in the ring-shaped electrode in a section along a shorter one of routes that connect the transmission pad and the reception pad to each other along the ring-shaped electrode.

DETAILED DESCRIPTION

Embodiments according to the present invention will now be described with reference to drawings.

First Embodiment

Figure 1A:
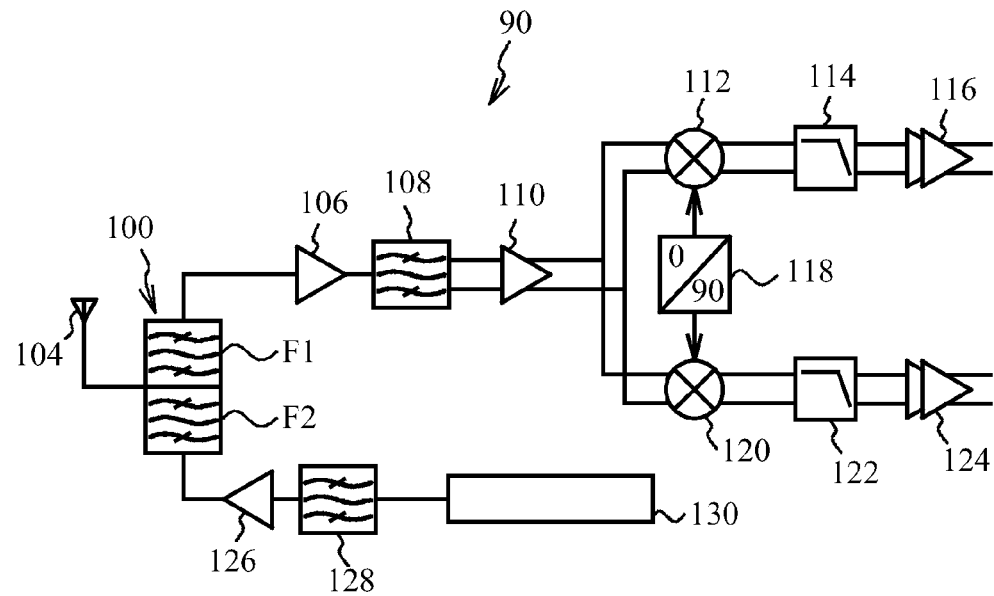
FIG. 1A is a view of an RF block.
Figure 1B:
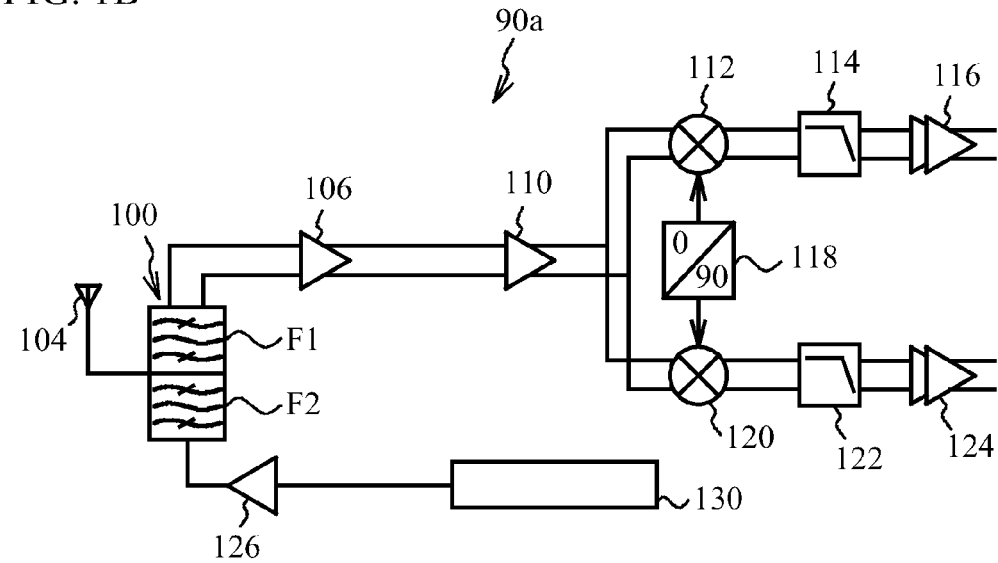
FIG. 1B is a view of an RF block with a reduced number of filters.

First, a description is given of an exemplary duplexer and an exemplary device using such a duplexer. As an example of the device, a description is given of a configuration of a radio frequency (RF) block. FIGS. 1A and 1B illustrate RF blocks.

Referring to FIG. 1A, an RF block 90 includes a duplexer 100, an antenna 104, amplifiers 106, 110, 116, 124, and 126, an interstage reception filter 108, mixers 112 and 120, low-pass filters 114 and 122, a local oscillator 118; and an interstage transmission filter 128. For example, the RF block is employed in an cellular phone, and corresponds to Band I of W-CDMA (wideband code division multiple access). In W-CDMA Band 1, the reception band ranges from 2110 to 2170 MHz, and the transmission band ranges from 1920 to 1980 MHz.

The duplexer 100 includes a reception filter F1 and a transmission filter F2, and is connected to the antenna 104. For example, the passband of the reception filter F1 is the same as the reception band of W-CDMA Band 1. For example, the passband of the transmission filter F2 is the same as the transmission band of W-CDMA Band 1. The antenna 104 receives a signal. The signal received by the antenna 104 is input to the reception filter F1 of the duplexer 100. The reception filter F1 passes a signal having a frequency within the passband among the input signals. The signal from the reception filter F1 is applied the amplifier 106. The reception filter F1 attenuates signals having frequencies outside of the passband. The amplifier 106 amplifies the received signal and outputs the amplified signal to the interstage reception filter 108. For example, the interstage reception filter 108 has unbalanced input terminals and balanced output terminals. The interstage reception filter 108 filters the signal, like the reception filter F1, and outputs the signal to the amplifier 110. The interstage reception filter 108 outputs the signals to the amplifier 110 via two output terminals. The amplifier 110 amplifies the signals and outputs the signals from two output terminals. The two signals output by the amplifier 110 are output to both the mixer 112 and 120. The local oscillator 118 outputs local signals to the mixers 112 and 120. The local signal input to the mixer 112 is different in phrase from the local signal input to the mixer 120 by 90 degrees. Each of the mixers 112 and 120 mixes the signal input from the amplifier 110 with the local signal, and down-converts the frequency of the signal. After a high-frequency component of the signal output from the mixer 112 is removed by the low-pass filter 114, the signal output from the mixer 112 is input to the amplifier 116. After a high-frequency component of the signal output from the mixer 112 is removed by the low-pass filter 122, the signal output from the mixer 112 is input to the amplifier 124. The amplifiers 116 and 124 amplify the received signals.

A transmitter 130 generates and outputs a transmission signal to the interstage transmission filter 128. For example, the interstage transmission filter 128 has an unbalanced input terminal and an unbalanced output terminal. After filtering a signal, the interstage transmission filter 128 outputs the signal to the amplifier 126. The amplifier 126 amplifies the received signal and outputs the amplified signal to the duplexer 100. For example, the transmission filter F2 provided in the duplexer 100 has an unbalanced input terminal and an unbalanced output terminal. The transmission filter F2 passes a signal having a frequency in the passband. The signal from the transmission filter F2 is output to the antenna 104. Signals having frequencies outside of the passband of the transmission filter F2 are suppressed. The antenna 104 transmits the signal.

In order to downsize the RF block, it is preferable to reduce the number of parts to simplify the structure. FIG. 1B is a view of an RF block 90a with a reduced number of filters.

The RF block 90a has a structure obtained by removing the interstage reception filter 108 and the interstage transmission filter 128 from the RF block 90 illustrated in FIG. 1A. The reception filter F1 provided in the duplexer 100 has two balanced output terminals connected to the amplifier 106. The amplifier 106 amplifies the two input signals. The amplified signals output from the amplifier 106 are input to the amplifier 110 without the intervention of the interstage reception filter 108, and are further amplified by the amplifier 110. The signal output from the transmitter 130 is input to the amplifier 126 without passing through the interstage transmission filter 128.

As illustrated in FIG. 1B, the size of the RF block can be reduced by removing the interstage reception filter 108 and the interstage transmission filter 128. However, a reduced number of filters may degrade the degree of suppression of the signal. For this reason, it is desired to improve the performance of the duplexer 100. Specifically, the reception filter F1 and the transmission filter F2 are desired to have an improved degree of suppression. For the improvement in the degree of suppression, it is important to obtain high isolation between the reception terminal and the transmission terminal of the duplexer 100. In particular, when the reception filter F1 and the transmission filter F2 are provided in a single package, the distance between the filters is reduced, and the size of the duplexer is thus reduced. However, the isolation may deteriorate between the transmission terminal and the reception terminal.

Figure 2A:
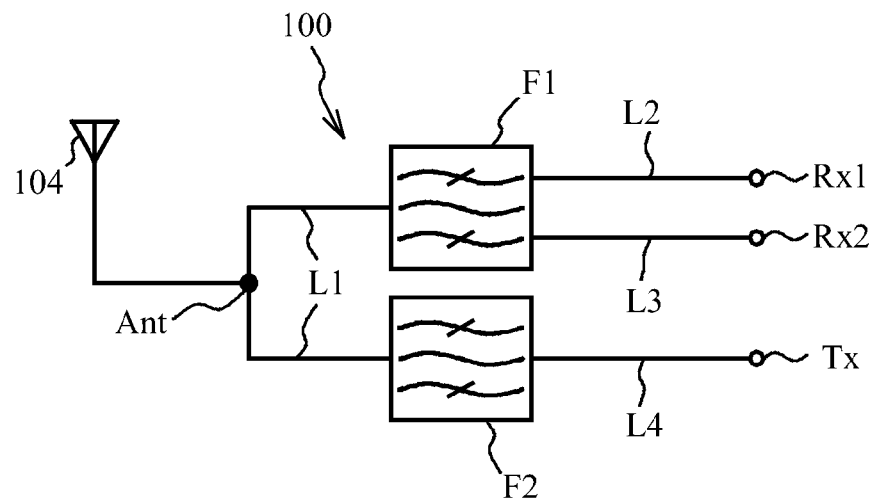
FIG. 2A is a block diagram of a duplexer.

Next, a structure of the duplexer is described. FIG. 2A is a block diagram of the duplexer, and FIG. 2B is a sectional view of the duplexer.

As illustrated in FIG. 2A, the duplexer 100 includes the reception filter F1 and the transmission filter F2. One end of the reception filter F1 is connected to an antenna terminal Ant. One end of the transmission filter F2 is connected to the antenna terminal Ant. Each of the reception filter F1 and the transmission filter F2, and the antenna terminal Ant are connected together by an interconnection L1. The other end of the reception filter F1 is connected to reception terminals Rx1 and Rx2 through interconnections L2 and L3, respectively. The other end of the transmission filter F2 is connected to the transmission terminal Tx through an interconnection L4. The reception terminals Rx1 and Rx2 are balanced terminals and are connected to the amplifier 106 illustrated in FIG. 1B. The transmission terminal Tx is an unbalanced terminal and is connected to the amplifier 126 illustrated in FIG. 1B. The antenna terminal Ant is connected to the antenna 104. As will be described later, the interconnections L1, L2, L3 and L4 are configured with a pad, a foot pad, an interconnection line, and a via interconnection, which are provided in the insulation substrate.

Figure 2B:
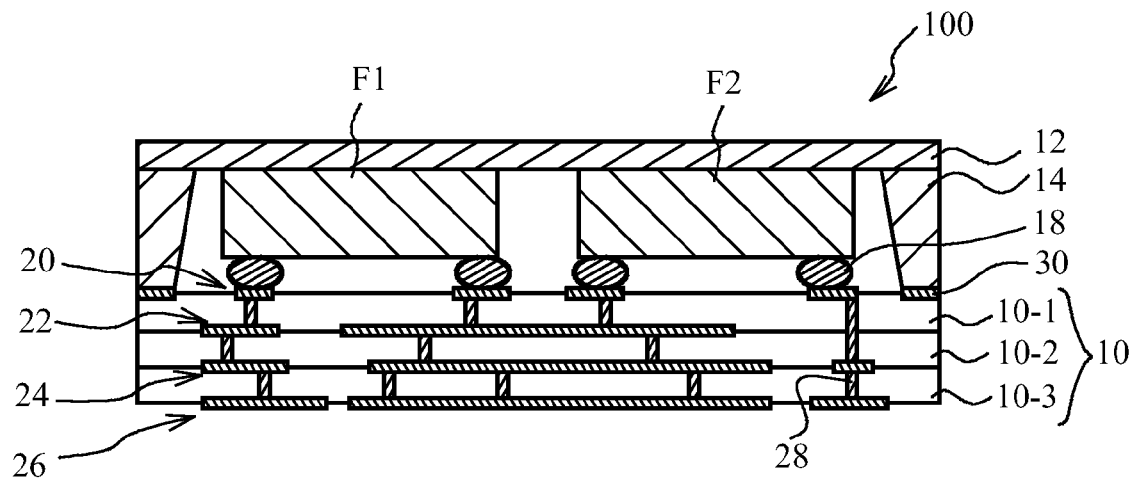
FIG. 2B is a sectional view of the duplexer.

As illustrated in FIG. 2B, the duplexer 100 includes the reception filter F1, the transmission filter F2, the insulation substrate 10, a lid 12, a sealing portion 14, an upper conductive layer 20, a first inner conductive layer 22, a second inner conductive layer 24, a foot pad layer 26, and via interconnections 28. The lid 12 is made of metal such as Kovar. The sealing portion 14 is made of solder such as Sn—Pb. The insulation substrate 10 has a multilayer structure in which insulation layers such as three ceramic layers of a first layer 10-1, a second layer 10-2, and a third layer 10-3 are stacked. For example, each layer is made of ceramic such as $Al_2O_3$ (aluminum oxide).

The upper conductive layer 20 is provided on the upper surface of the first layer 10-1. The first inner conductive layer 22 is provided between the first layer 10-1 and the second layer 10-2. The second inner conductive layer 24 is provided between the second layer 10-2 and the third layer 10-3. The foot pad layer 26 is provided on the lower surface of the third layer 10-3. As described above, the upper conductive layer 20 is provided on the upper surface of the insulation substrate 10, and the first and second inner conductive layers 22 and 24 are provided within the insulation substrate 10, the foot pad layer 26 being provided on the lower surface of the insulation substrate 10. The layers are electrically connected to one another through via interconnections 28 extending in the thickness direction of the insulation substrate 10 (the vertical direction in the drawing). For example, the first inner conductive layer 22, the second inner conductive layer 24, and the via interconnections 28 are each made of a metal such as Ag (silver), Cu (copper), or W (tungsten). For example, the upper conductive layer 20 and the foot pad layer 26 each include a conductive layer made of metal such as Ag, Cu, or W, a plating layer formed on the conductive layer and made of metal such as Au (gold) or Ni (nickel). For example, the conductive layer is formed by printing, and the plating layer is formed by electrolytic plating.

For example, the reception filter F1 and the transmission filter F2 are flip-chip mounted on the upper surface of the insulation substrate 10. For example, the reception filter F1 and the transmission filter F2 are electrically connected to the upper conductive layer 20 via bumps each made of a metal such as gold or solder. The reception filter F1 and the transmission filter F2 are sealed with the lid 12 and the sealing portion 14. Specifically, the lid 12 is provided on the reception filter F1 and the transmission filter F2, and the sealing portion 14 is provided between the insulation substrate 10 and the lid 12. The upper conductive layer 20 includes a ring-shaped electrode 30 formed at the outer periphery of the insulation substrate 10. The sealing portion 14 joins the ring-shaped electrode 30 with the lid 12. Therefore, the reception filter F1 and the transmission filter F2 are highly hermetically sealed. Thus, the ring-shaped electrode 30 is used for sealing. In this case, the sealing portion 14 is not electrically connected to the reception filter F1 and the transmission filter F2.

Figure 3A:
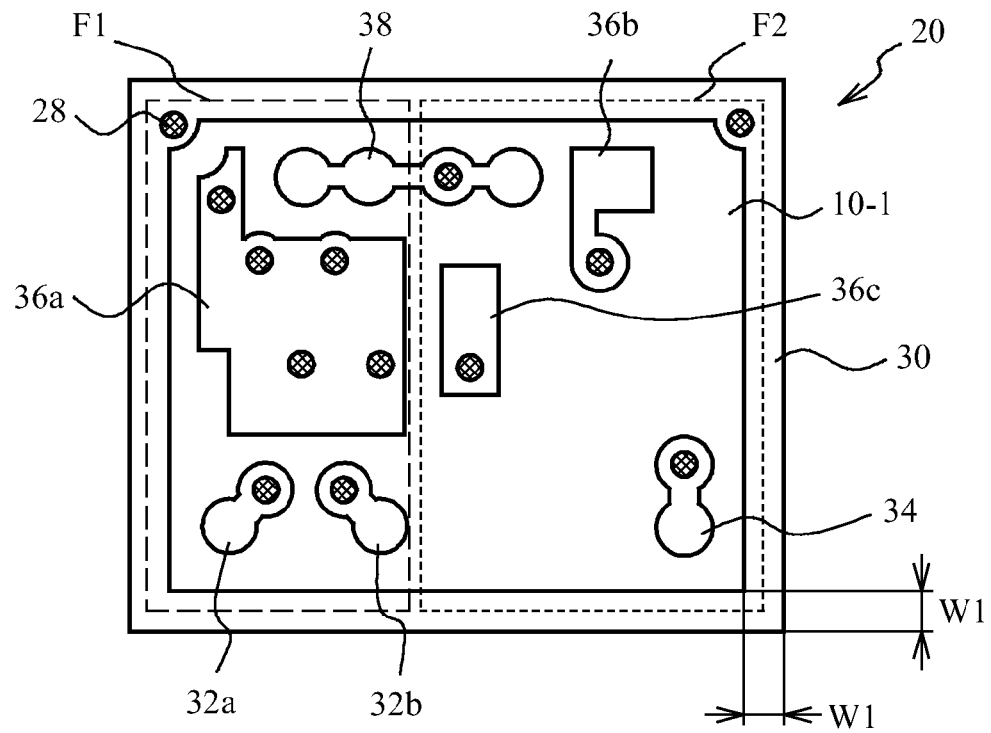
FIG. 3A is a plan view of an upper conductive layer of an insulation substrate provided in the duplexer.
Figure 3B:
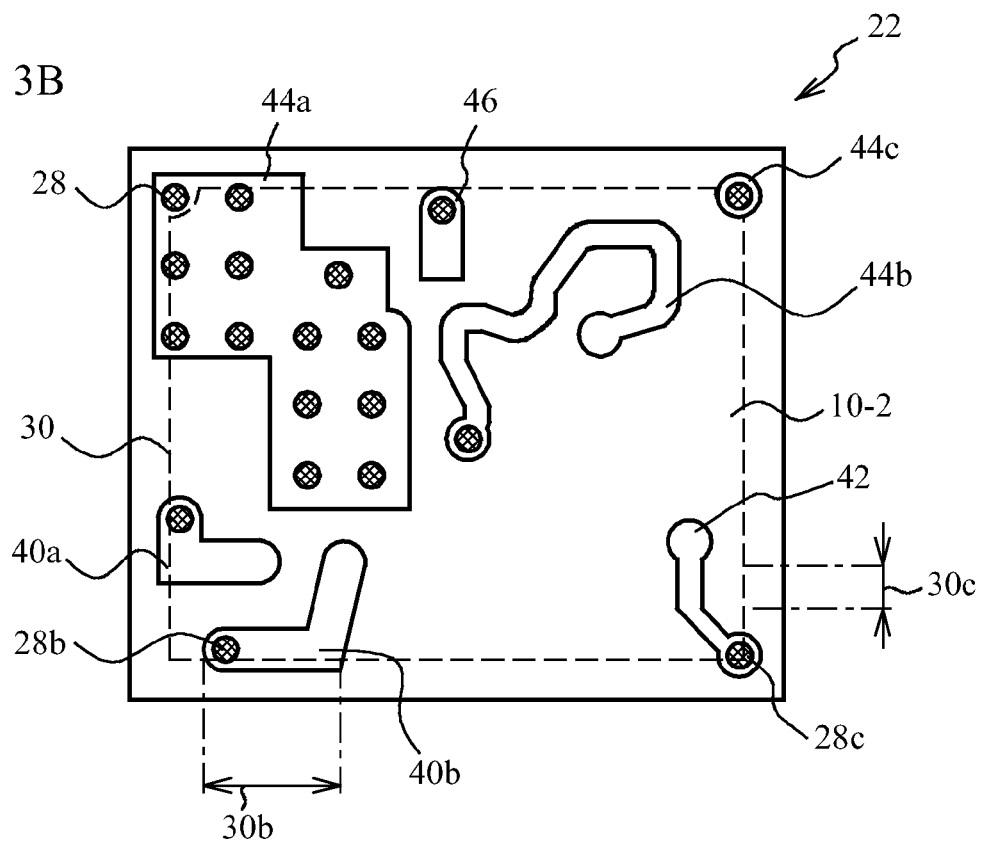
FIG. 3B is a plan view of a first inner conductive layer within the insulation substrate provided in the duplexer.
Figure 4A:
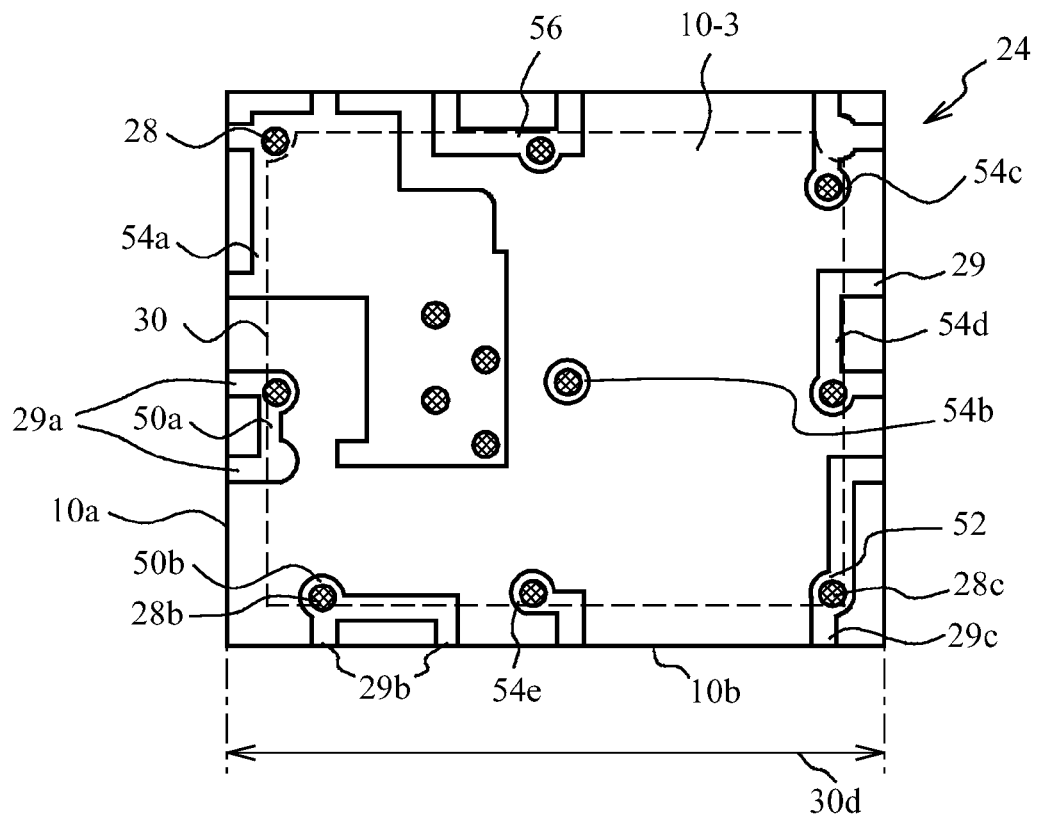
FIG. 4A is a plan view of a second inner conductive layer within the insulation substrate provided in the duplexer.
Figure 4B:
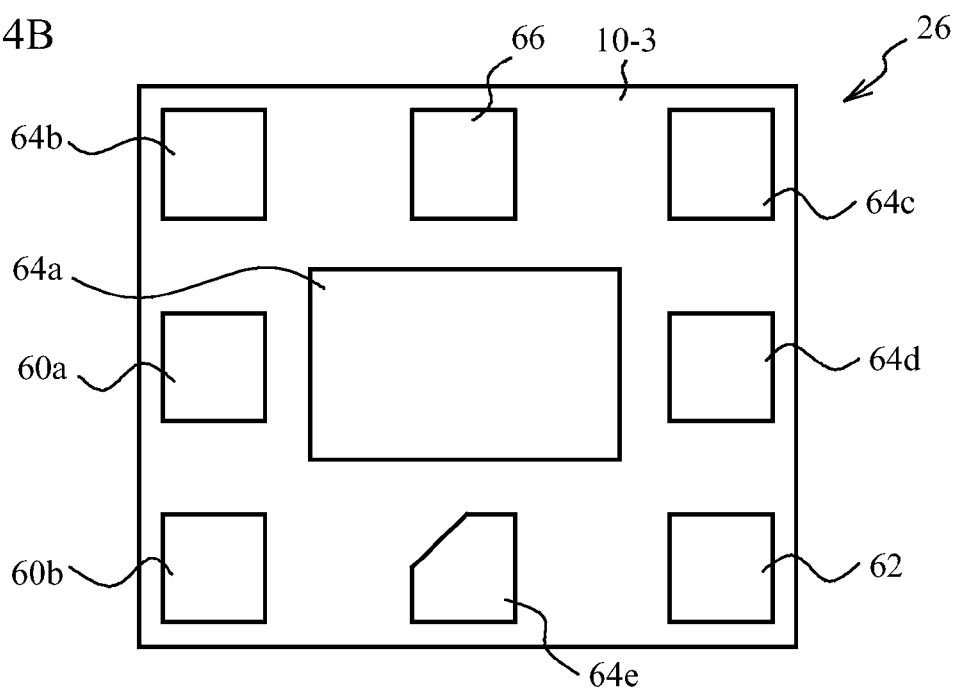
FIG. 4B is a plan view of a lower conductive layer of the insulation substrate provided in the duplexer.

Next, each layer provided in the insulation substrate 10 will be described in detail. FIG. 3A is a plan view of the upper conductive layer of the insulation substrate provided in the duplexer, and FIG. 3B is a plan view of the first inner conductive layer within the insulation substrate provided in the duplexer. FIG. 4A is a plan view of the second inner conductive layer within the insulation substrate provided in the duplexer, and FIG. 4B is a plan view of the lower conductive layer of the insulation substrate provided in the duplexer. Grid lines depict the via interconnections 28 extending in the depth direction of the drawings.

As illustrated in FIG. 3A, the upper conductive layer 20 is provided on the upper surface of the first layer 10-1 of the insulation substrate 10. The upper conductive layer 20 includes the ring-shaped electrode 30, reception pads 32a and 32b, a transmission pad 34 (a pad for signals), ground pads 36a, 36b, and 36c, and an antenna pad 38. A broken line illustrated in FIG. 3 indicates an area where the reception filter F1 is mounted, and a dotted line indicates an area where the transmission filter F2 is mounted. The reception filter F1 is electrically connected to the two reception pads 32a and 32b, the ground pad 36a, and the antenna pad 38. The reception pads 32a and 32b function as balanced terminals. The transmission filter F2 is electrically connected to the transmission pad 34, the ground pads 36b and 36c, and the antenna pad 38. The antenna pad 38 is used for both the reception filter F1 and the transmission filter F2. A width (line width) W1 of the ring-shaped electrode 30 is constant. The ring-shaped electrode 30 is provided along the outer periphery of the insulation substrate 10. In other words, the ring-shaped electrode 30 is in contact with edges the insulation substrate 10. The ring-shaped electrode 30 surrounds the reception pads 32a and 32b, the transmission pad 34, the ground pads 36a, 36b, and 36c, and the antenna pad 38. Also, the ring-shaped electrode 30 contacts the sealing portion 14 (see FIG. 2B). Also, the upper conductive layer 20 is electrically connected to the first inner conductive layer 22 through the via interconnections 28 penetrating through the first layer 10-1.

As illustrated in FIG. 3B, the first inner conductive layer 22 is provided on the upper surface of the second layer 10-2. The first inner conductive layer 22 includes reception lines 40a and 40b, a transmission line 42, ground lines 44a, 44b, and 44c, and an antenna line 46. The reception pad 32a provided in the upper conductive layer 20 illustrated in FIG. 3A is electrically connected to the reception line 40a provided in the first inner conductive layer 22 illustrated in FIG. 3B through the via interconnection 28 penetrating through the first layer 10-1. The reception pad 32b is electrically connected to the reception line 40b through the via interconnection 28. The transmission pad 34 is electrically connected to the transmission line 42 through the via interconnection 28. The ring-shaped electrode 30 is electrically connected to the ground lines 44a and 44c through the via interconnection 28. The ground pad 36a is electrically connected to the ground lines 44a through the via interconnection 28. The ground pads 36b and 36c are electrically connected to the ground line 44b through the via interconnection 28. The antenna pad 38 is electrically connected to the antenna line 46 through the via interconnection 28. Also, the first inner conductive layer 22 is electrically connected to the second inner conductive layer 24 through the via interconnection 28 penetrating through the second layer 10-2. The broken line illustrated in FIG. 3B indicates an area that overlaps the ring-shaped electrode 30, when the insulation substrate 10 is viewed from its top face. A description will be given of the relationship between the interconnections, the via interconnections and the ring-shaped electrode 30 in connection with a second embodiment. Areas 30c and 30d will be described in the second embodiment.

As illustrated in FIG. 4A, the second inner conductive layer 24 is provided on the upper surface of the third layer 10-3. The second inner conductive layer 24 includes power supply lines 29, reception lines 50a and 50b, a transmission line 52, ground lines 54a, 54b, 54c, 54d, and 54e, and an antenna line 56. The reception line 40a provided in the first inner conductive layer 22 illustrated in FIG. 3B is electrically connected to the reception line 50a illustrated in FIG. 4A through the via interconnection 28 penetrating through the second layer 10-2. The reception line 40b is electrically connected to the reception line 50b through a via interconnection 28b out of the multiple via interconnections 28. The transmission line 42 is electrically connected to the transmission line 52 through a via interconnection 28c out of the multiple via interconnections 28. The ground line 44a is electrically connected to the ground line 54a through the via interconnection 28. The ground line 44b is electrically connected to the ground line 54b through the via interconnection 28. The ground line 44c is electrically connected to the ground line 54c through the via interconnection 28. The antenna line 46 is electrically connected to the antenna line 56 through the via interconnection 28.

Also, the reception lines 50a and 50b, the transmission line 52, the ground line 54a, 54c, 54d, and 54e, and the antenna line 56 are electrically connected to the power supply lines 29 extending up to the edges of the insulation substrate 10. For example, the power supply lines 29 is made of a metal layer that is the same as the reception lines 50a and 50b, the transmission line 52, the ground lines 54a, 54c, 54d, and 54e, and the antenna line 56. The power supply lines 29 are used for supplying power in an electrolytic plating process for forming a plating layer on the upper conductive layer 20 and the foot pad layer 26. Some of the multiple power supply lines 29 are specifically defined as follows. A power supply line 29a is connected to the reception line 50a. A power supply line 29b is connected to the reception line 50b. A power supply line 29c is connected to the transmission line 52. A portion 30b of the ring-shaped electrode 30, and the power supply lines 29b and 29c which are illustrated in the drawing will be described in the second embodiment. Sides 10a and 10b will be described in a third embodiment. Here, explanation of the insulation substrate 10 is continued with reference to FIG. 4B. The second inner conductive layer 24 is electrically connected to the foot pad layer 26 through the via interconnection 28 penetrating through third layer 10-3.

As illustrated in FIG. 4B, the foot pad layer 26 is provided on the lower surface of the third layer 10-3. Additionally, FIG. 4B illustrates the lower surface of the third layer 10-3 when the third layer 10-3 is transparently viewed. The foot pad layer 26 includes: reception foot pads 60a and 60b, a transmission foot pad 62 (signal foot pad); ground foot pads 64a, 64b, 64c, 64d, and 64e; and an antenna foot pad 66. The reception line 50a provided in the second inner conductive layer 24 illustrated in FIG. 4A is electrically connected to the reception foot pad 60a provided in the foot pad layer 26 illustrated in FIG. 4B through the via interconnection 28 penetrating through the third layer 10-3. The reception line 50b is electrically connected to the reception foot pad 60b through the via interconnection 28b among the plural via interconnections 28. The transmission line 52 is electrically connected to the transmission foot pad 62 through the via interconnection 28c among the plural via interconnections 28. The ground line 54a is electrically connected to the ground foot pads 64a and 64b through the via interconnection 28. The ground line 54b is electrically connected to the ground foot pad 64a through the via interconnection 28. The ground line 54c is electrically connected to the ground foot pad 64c through the via interconnection 28. The ground line 54d is electrically connected to the ground foot pad 64d through the via interconnection 28. The ground line 54e is electrically connected to the ground foot pad 64e through the via interconnection 28. The antenna line 56 is electrically connected to the antenna foot pad 66 through the via interconnection 28.

The reception foot pads 60a and 60b illustrated in FIG. 4B correspond to the reception terminals Rx1 and Rx2 illustrated in FIG. 2A. The transmission foot pad 62 corresponds to the transmission terminal Tx. The antenna foot pad 66 corresponds to the antenna terminal Ant. The antenna pad 38, the via interconnection 28, the antenna lines 46 and 56 correspond to the interconnection L1 illustrated in FIG. 2A. The reception pad 32a, the via interconnection 28, the reception lines 40a and 50a correspond to the interconnection L2 illustrated in FIG. 2A. The reception pad 32b, the via interconnection 28b, the reception lines 40b and 50b correspond to the interconnection L3 illustrated in FIG. 2A. The transmission pad 34, the via interconnection 28c, the transmission lines 42 and 52, which connect the transmission filter F2 and the transmission foot pad 62, correspond to the interconnection L4 illustrated in FIG. 2A.

As illustrated in FIGS. 2B to 4B, the reception filter F1 and the transmission filter F2 are flip-chip mounted on the same insulation substrate 10 to make a single package, so that the duplexer can be downsized. Further, the conductive layers are formed within the insulation substrate 10 to suppress the size of the insulation substrate 10 from increasing. Thus, the duplexer may be downsized. Furthermore, the ring-shaped electrode 30 is formed along the outer periphery of the insulation substrate 10, and the sealing portion 14 is jointed to the ring-shaped electrode 30. It is thus possible to ensure high hermetic sealing. However, the arrangement of the reception filter F1 and the transmission filter F2 mounted on the same insulation substrate 10 reduces the distance between the reception filter F1 and the transmission filter F2. Moreover, many pads, foot pads, interconnections, and via interconnections are provided within the single insulation substrate. For this reason, the distance between the pads and the distance between the foot pads are reduced. Thus, the isolation between the transmission terminal Tx and the reception terminal Rx may deteriorate. Additionally, the use of the ring-shaped electrode 30 tends to degrade the isolation, as will be described later.

Figure 5:
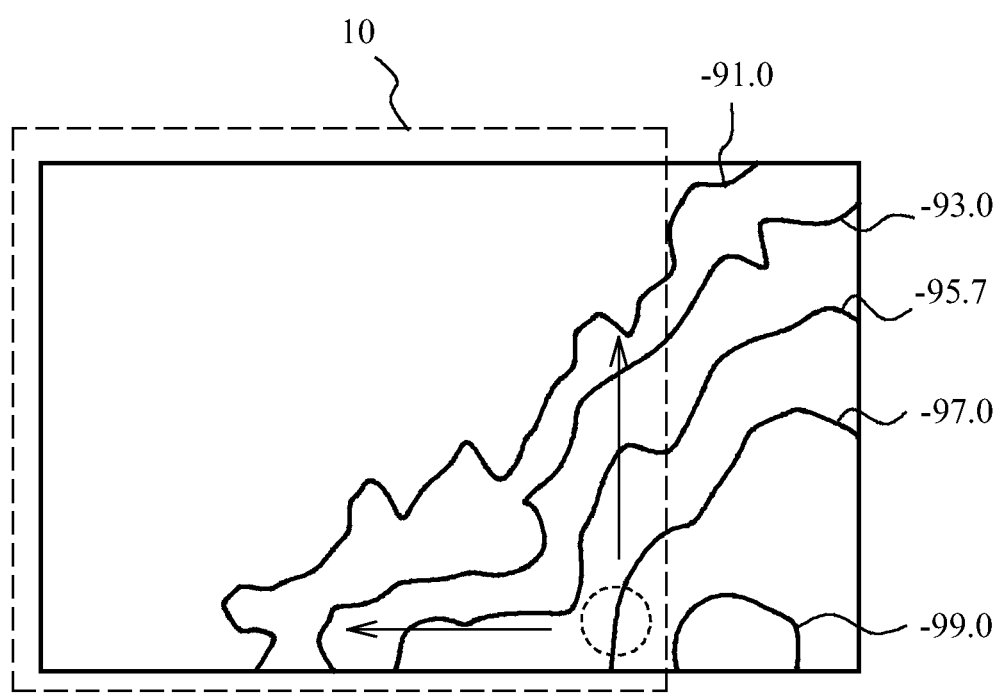
FIG. 5 is a schematic view of a magnetic field between a transmission pad and a reception pad.

In order to verify the cause of the isolation deterioration, the inventors conducted an experiment to measure the magnetic field generated in the insulation substrate 10. In the experiment, the insulation substrate 10 on which the reception filter F1 and the transmission filter F2 were not mounted was used as a sample. The insulation substrate 10 was placed in an experimental device and a signal having a frequency of 1920 MHz and a power of 0 dBm was input to the transmission foot pad 62, and the magnetic field generated on the upper surface of the insulation substrate 10 was measured. FIG. 5 is a schematic view of the magnetic field generated on the upper surface of the insulation substrate 10. Solid lines illustrated in the drawing each indicate a magnetic field having the same magnitude. A broken line illustrated in the drawing indicates an area where the insulation substrate 10 is arranged. A circle illustrated by a dotted line indicates the positions of the transmission foot pad 62 and the transmission pad 34.

As indicated by the solid lines in FIG. 5, the magnitudes of the magnetic fields were −99.0 dBm, −97.0 dBm, −95.7 dBm, and −93.0 dBm, in the order closer to the transmission pad 34. Thus, the magnetic field was generated at the lower right area of the insulation substrate 10 where the transmission pad 34 is positioned. The magnitude of the magnetic field was greater as the magnetic field was closer to the transmission pad 34. In particular, the strong magnetic field was observed in the direction along the outer periphery of the insulation substrate 10. The cause of generating the magnetic field will be discussed.

The signal input to the transmission foot pad 62 (see FIG. 4B) provided on the lower surface of the insulation substrate 10 arrives at the transmission pad 34 (see FIG. 3A) provided on the upper surface of the insulation substrate 10 through the via interconnection 28, and the transmission lines 42 and 52. One or both of electrostatic coupling and magnetic coupling occurs between the ring-shaped electrode 30 and the signal arriving at the transmission pad 34. As a result, the electric current flows in the ring-shaped electrode 30 (see an arrow illustrated in FIG. 5). The electric current flows in the ring-shaped electrode 30 to generate a magnetic field around the ring-shaped electrode 30. When the electric current flows in the ring-shaped electrode 30 extending in the left direction of FIG. 5, an electric current flows in the reception pads 32a and 32b by the electrostatic coupling. When the electric current flows into the ring-shaped electrode 30, the magnetic field is also generated in an area around the reception pads 32a and 32b (see FIG. 3A). At this time, the electric current flows in the reception pads 32a and 32b by the magnetic coupling. This may degrade the isolation between the reception pads 32a and 32b, and the transmission pad 34. Therefore, the isolation between the reception foot pads 60a and 60b, and the transmission foot pad 62 deteriorate. As illustrated in FIG. 5, the magnitude of the magnetic field is greater as being closer to the transmission pad 34. Thus, among the plural reception pads 32a and 32b, the reception pad 32b closer to the transmission pad 34 tends to be influenced by the magnetic field. Thus, in particular, the isolation between the transmission foot pad 62 and the reception foot pad 60b tends to deteriorate.

Figure 6A:
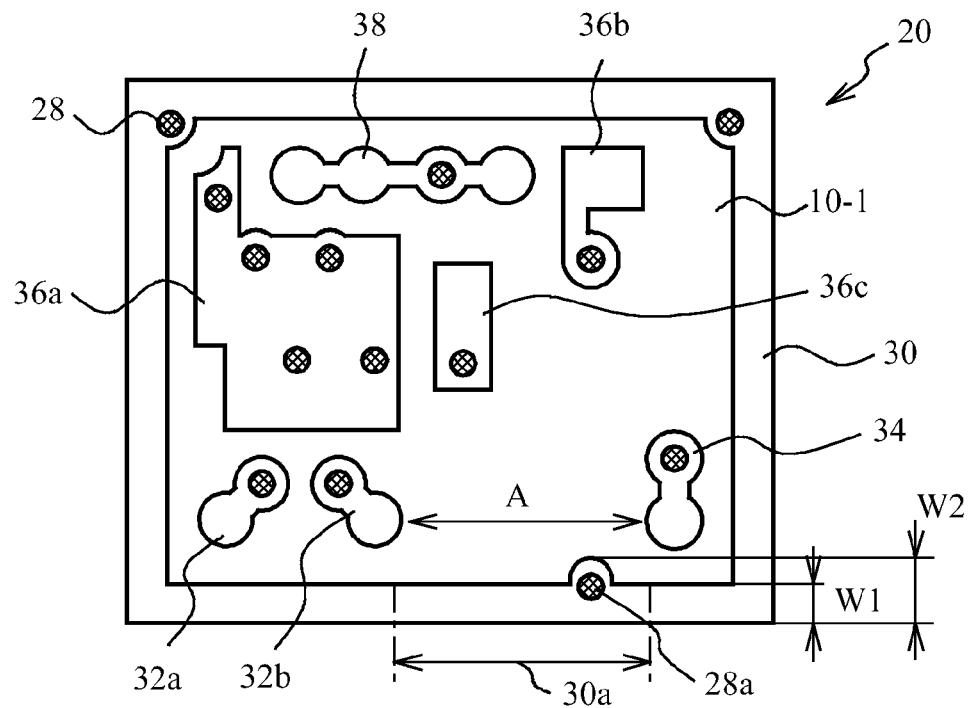
FIG. 6A is a plan view of the upper conductive layer of the insulation substrate provided in the duplexer according to a first embodiment.
Figure 6B:
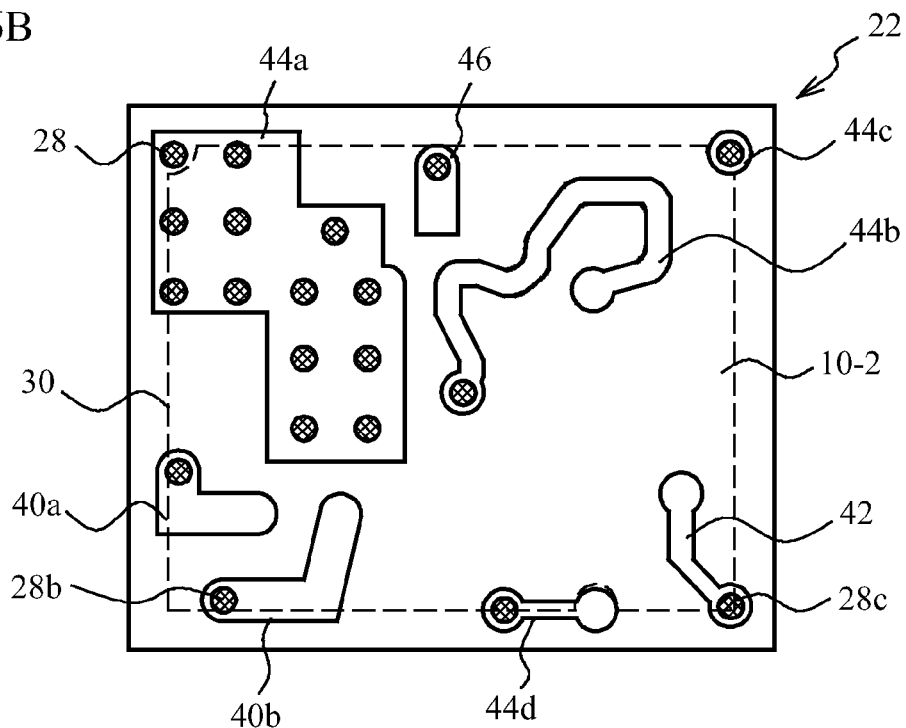
FIG. 6B is a plan view of the first inner conductive layer within the insulation substrate provided in the duplexer according to the first embodiment.

The first embodiment has an exemplary structure in which via interconnections are added to the ring-shaped electrode 30 to improve the isolation. FIG. 6A is a plan view of the upper conductive layer of the insulation substrate provided in the duplexer according to the first embodiment. FIG. 6B is a plan view of the first inner conductive layer within the insulation substrate provided in the duplexer according to the first embodiment. A description of the same components as the previously described components illustrated in FIGS. 3A to 4B is omitted here.

As illustrated in FIG. 6A, a via interconnection 28a is connected to the ring-shaped electrode 30 of the first layer 10-1. The via interconnection 28a is provided in the ring-shaped electrode 30 in a portion or section 30a along a shorter one of two routes that connect the reception pad 32b and the transmission pad 34 to each other along the ring-shaped electrode 30. In FIG. 6A, the shorter route along the ring-shaped electrode 30 is indicated by an arrow A. The longer route includes the four sides of the ring-shaped electrode 30. A width W2 of the portion at which the via interconnection 28a is provided in the ring-shaped electrode 30 is larger than a width W1 of the portion at which the via interconnection 28a is not provided in the ring-shaped electrode 30.

As illustrated in FIG. 6B, the via interconnection 28a penetrates through the first layer 10-1, and is electrically connected to a ground line 44d included in the first inner conductive layer 22. The ground line 44d is electrically connected to the ground line 54e included in the second inner conductive layer 24 and the ground foot pad 64e included in the foot pad layer 26 through the via interconnection 28a. That is, the ring-shaped electrode 30 is grounded through the via interconnection 28a. Thus, the duplexer according to the first embodiment has the same structure as the duplexer illustrated in FIGS. 3A and 4B, except that the via interconnection 28a and the ground line 44d are further provided and the width of the ring-shaped electrode 30 is changed.

Figure 7A:
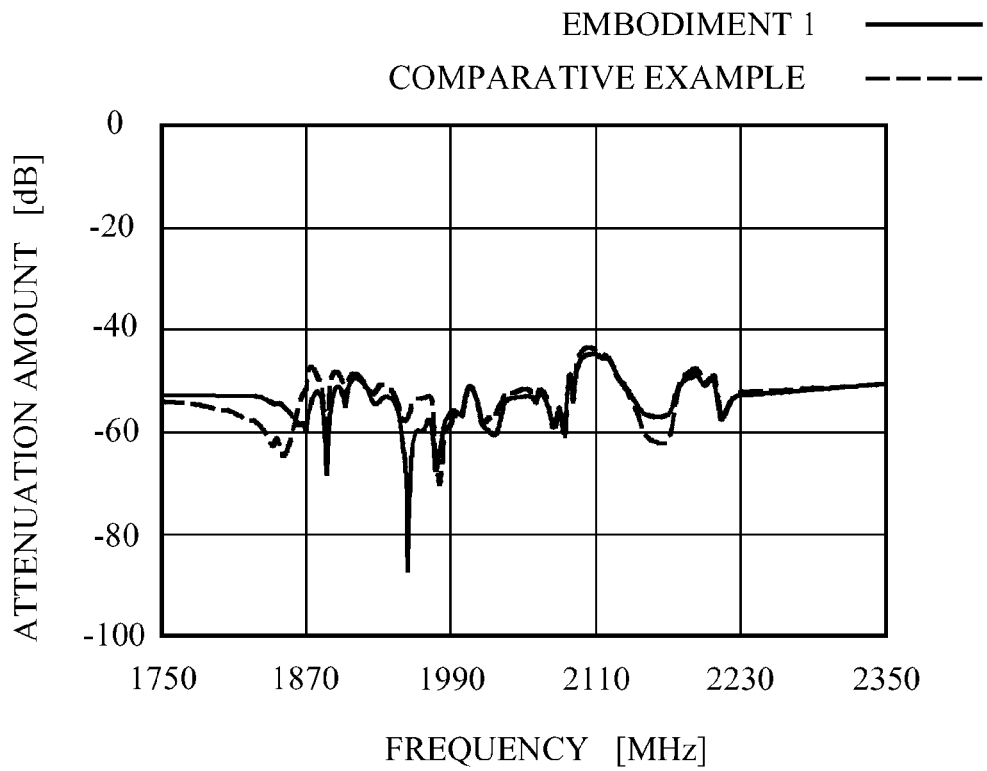
FIGS. 7A and 7B illustrate calculation results of the isolation of the duplexer according to the first embodiment.
Figure 7B:
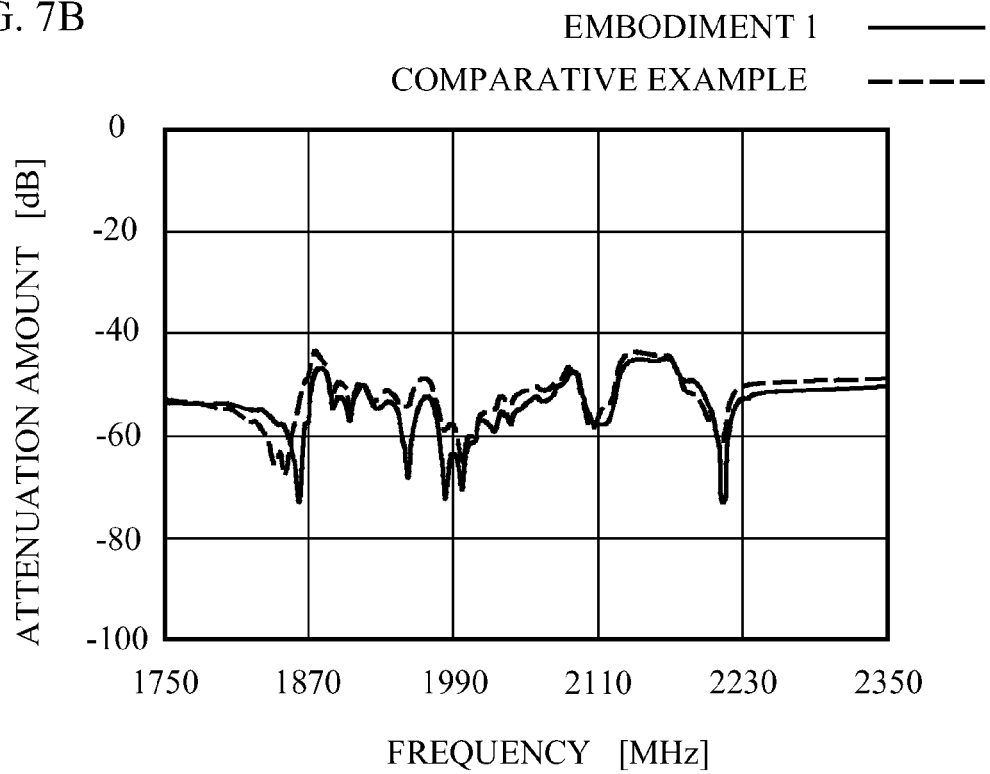

Next, a description will be given of a simulation directed to calculating the isolation of the duplexer according to the first embodiment. In the simulation, the duplexer was connected to the antenna 104 as illustrated in FIG. 2A, and the signals output from the reception terminals Rx1 and Rx2 (corresponding to the reception foot pads 60a and 60b in FIG. 4B) were calculated when a signal was input from the transmission terminal Tx (corresponding to the transmission foot pad 62 in FIG. 4B). A calculation result of the first embodiment was compared with a comparative example of a duplexer having insulation substrate 10 illustrated in FIGS. 3A to 4B. A filter having a combination of a SAW resonator and a double mode coupling type SAW filter (Double Mode SAW filter: DMS filter) was used as the reception filter F1. A ladder type SAW filter was used as the transmission filter F2. A package of the duplexer had a size of 2.0×1.6 mm and a depth of 0.55 mm. The passband of the reception filter F1 was set equal to the reception band of W-CDMA Band 1, and the passband of the transmission filter F2 was set equal to the transmission band of W-CDMA Band 1. The passband of F1 and that of F2 are specifically described below.
The passband of the reception filter F1: from 2110 to 2170 MHz
The passband of the transmission filter F2: from 1920 to 1980 MHz FIGS. 7A and 7B illustrate the calculation results of the isolation of the duplexer according to the first embodiment. FIG. 7A illustrates the calculation results of the signals output from the reception foot pad 60a. FIG. 7B illustrates the calculation results of the signal output from the reception foot pad 60b. The horizontal axis represents the frequency, and the vertical axis represents the attenuation amount. The attenuation amount represents the magnitude of a signal leaking out from the transmission foot pad to the reception foot pad. Further, a solid line represents the calculation result of the duplexer according to the first embodiment, and a broken line represents the duplexer according to the comparative example.

As illustrated in FIG. 7A, the signal in the first embodiment was more suppressed than that of the comparative example. The signal was suppressed, in particular, in the transmission band. The suppression of the signal means an improvement in the isolation between the transmission foot pad 62 and the reception foot pad 60a. The signal was greatly suppressed in the frequency band from 1920 to 1980 MHz, which corresponds to the passband of the transmission filter F2.

As illustrated in FIG. 7B, the isolation between the transmission foot pad 62 and the reception foot pad 60b in the first embodiment was more improved than that of the comparative example. Moreover, the signal was suppressed within a wide frequency band, as compared with the results of FIG. 7A.

In the first embodiment, the via interconnection 28a is provided in the ring-shaped electrode 30 in the section 30a along the shorter route A connecting the reception pad 32b and the transmission pad 34 together. For this reason, the electric current that flows in the ring-shaped electrode 30 depending on the transmission signals flows into the foot pad 64e through the via interconnection 28a. Since this reduces the electric current flowing in the ring-shaped electrode 30, the magnetic field depending on the current is also reduced. Thus, the magnetic field generated around the reception pad 32a and 32b is also reduced. Reduced electric current that flows in the ring-shaped electrode 30 suppresses the electrostatic coupling and the magnetic coupling between the reception pads 32a and 32b, and suppresses the electric current that flows in the ring-shaped electrode 30. This results in an improved isolation between the reception foot pads 60a and 60b and the transmission foot pad 62.

As indicated in FIG. 5, the magnetic field is stronger as closer to the transmission pad 34. Accordingly, the isolation between the transmission foot pad 62 and the reception foot pad 60b tends to deteriorate. As illustrated in FIG. 6A, the via interconnection 28a is provided between the transmission pad 34 and the reception pad 32b closer thereto among the multiple reception pads 32a and 32b in the first embodiment. Since the electric current flowing in the ring-shaped electrode 30 flows into the via interconnection 28a, the electric current arriving at the vicinity of the reception pad is reduced. Thus, the magnetic field generated around the reception pad 32b is reduced to improve the isolation between the transmission foot pad 62 and the reception foot pad 60b. The number of the via interconnection 28a provided in the ring-shaped electrode 30 is not limited to one, and may be more than one.

The width W2 of the portion of the ring-shaped electrode 30 where the via interconnection 28a is provided is greater than the width W1 of the portion of the ring-shaped electrode 30 where the via interconnection 28a is not provided. In other words, when the via interconnection 28a is provided, the width W1 of the portion where the via interconnection 28a is not provided may not have to be increased, but may be the same as, for example, that of the comparative example. This suppresses the increase in the electric current flowing in the ring-shaped electrode 30, thereby suppressing the magnetic field.

The insulation substrate 10 has a rectangular shape when viewed from its top face. In FIG. 3A, the reception pads 32*a* and 32*b* are positioned at the lower left corner, and the transmission pad 34 is positioned at the lower right corner, the antenna pad 38 being positioned in the vicinity of the upper side. However, the positions of the pads may be changed. The insulation substrate 10 may have a square shape, a polygonal shape except for a quadrangle shape, or another shape.

Figure 8:
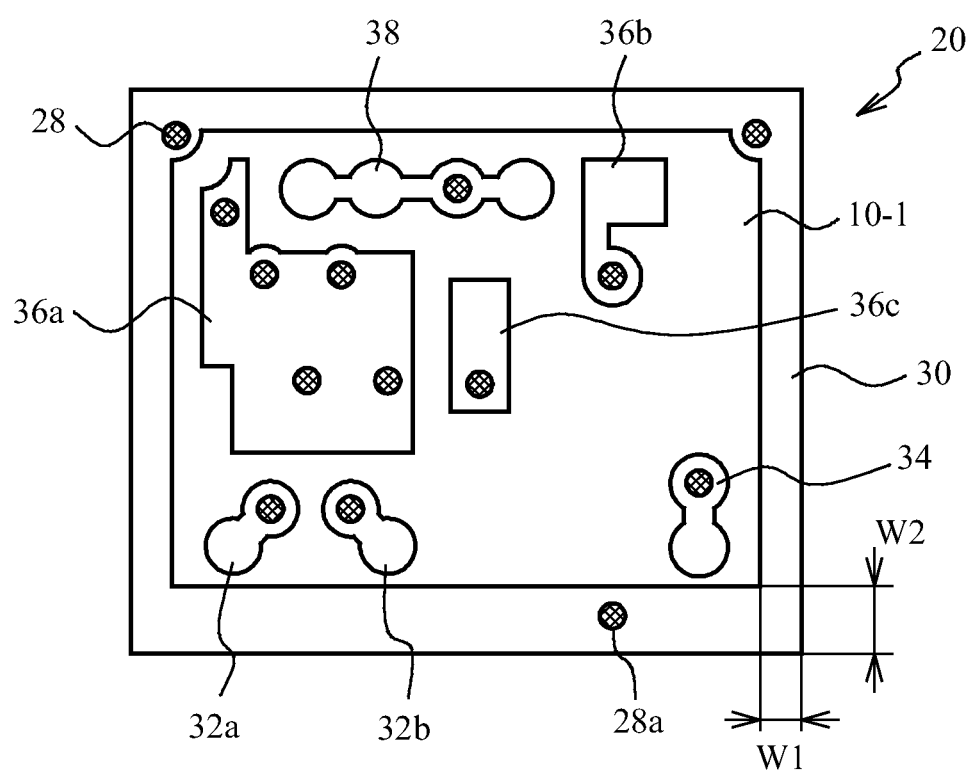
FIG. 8 is a plan view of the upper conductive layer of the insulation substrate provided in the duplexer according to a variation of the first embodiment.

Next, a variation of the first embodiment will be described. FIG. 8 is a plan view of the upper conductive layer of the insulation substrate provided in a duplexer according to the variation of the first embodiment. The explanation of the same components as those illustrated in FIGS. 6A and 6B is omitted.

As illustrated in FIG. 8, the via interconnection 28*a* electrically connected to the ground foot pad is provided in the ring-shaped electrode 30 in the section 30*a* along the shorter route connecting the transmission pad 34 and the reception pad 32*b* together. The width W2 of the ring-shaped electrode 30 along the side where the via interconnection 28*a* is provided is constant. The width W2 is greater than the width W1 along the sides where the via interconnection 28*a* of the ring-shaped electrode 30 is not provided. Like the first embodiment, the variation of the first embodiment can ensure high isolation. However, the width W2 of the ring-shaped electrode 30 along the side where the via interconnection 28*a* is provided is greater than the width W1 thereof along the remaining sides. Thus, a larger electric current may flow in the ring-shaped electrode 30. In order to suppress the electric current flowing in the ring-shaped electrode 302 and to more effectively realize high isolation, it is preferable to increase the width of the ring-shaped electrode along the side where the via interconnection 28*a* is provided, as illustrated in FIG. 6A.

Second Embodiment

A second embodiment has an exemplary structure in which the inner conductive layer within the insulation substrate 10 is changed. First, a description will be given of a problem with the inner conductive layers illustrated in FIGS. 3A to 4B.

As illustrated in FIG. 3B, a part of the reception line 40*b* is parallel to the portion 30*b*, which is the closest to the reception line 40*b* of the ring-shaped electrode 30 (see the arrow and the chain line in the drawing). As illustrated in FIG. 5, the magnetic field is generated around the ring-shaped electrode 30. When the reception line 40*b* is parallel to the ring-shaped electrode 30, the electric current tends to flow in the reception line 40*b* by the magnetic field generated around the ring-shaped electrode 30. Thus, the current electric flowing in the ring-shaped electrode 30 tends to be coupled with the reception line 40*b*. A part of the transmission line 42 is parallel to the portion 30*c* of the ring-shaped electrode 30, which is the closest to the transmission line 42 (see the arrow and the chain line in the drawing). For this reason, the electric current flowing in the ring-shaped electrode 30 tends to be coupled with the transmission line 42.

When the insulation substrate 10 is viewed from its top face, a part of the reception line 40*b* and a part of the transmission line 42 overlap the ring-shaped electrode 30. As illustrated in FIG. 5, the magnetic field is stronger as the area is closer to the ring-shaped electrode 30. Thus, the influence of the reception line 40*b* on the magnetic field is greater as the distance between the ring-shaped electrode 30 and the reception line 40*b* is smaller. Also, the electrostatic coupling is greater. This holds true for the transmission line 42. Thus, since the reception line 40*b* and the transmission line 42 partly overlap the ring-shaped electrode 30, these lines tend to be magnetically and electrically coupled with the ring-shaped electrode 30. Further, a part of the via interconnection 28*b* connected to the reception line 40*b* and the via interconnection 28*c* connected to the transmission line 42 overlap the ring-shaped electrode 30. This arrangement increases the magnetic coupling between the ring-shaped electrode 30 and the via interconnections 28*b* and 28*c* and the electrostatic coupling therebetween. As mentioned above, the ring-shaped electrode 30 tends to be coupled with each of the reception line 40*b*, the transmission line 42, and the via interconnections 28*b* and 28*c*.

As illustrated in FIG. 4A, when the insulation substrate 10 is viewed from its top face, a part of the reception line 50*b* and a part of the transmission line 52 overlap the ring-shaped electrode 30. A part of the via interconnection 28*c* connected to the transmission line 52 and a part of the via interconnection 28*b* connected to the reception line 50*b* overlap the ring-shaped electrode 30. Thus, the electric current flowing in the ring-shaped electrode 30 tends to be coupled with each of the reception line 50*b*, the transmission line 52, and the via interconnections 28*b* and 28*c*. Thus, the isolation deteriorates.

The power supply lines 29*a*, 29*b*, and 29*c* illustrated in FIGS. 4A and 29*c* are used for supplying power in electrolytic plating, and are not involved in making a connection between the reception pad 32*b* and the reception foot pad 60*b* or between the transmission pad 34 and the transmission foot pad 62. That is, the power supply lines 29*a*, 29*b* and 29*c* are not interconnections for carrying reception signals and transmission signals. Therefore, the influence of the power supply lines 29*a*, 29*b* and 29*c* on the isolation is smaller than that of the reception line 50*b* and the transmission line 52 on the isolation. However, the power supply lines may be coupled with each other and the isolation may deteriorate. The area 30*d* extends in the direction of the shorter route A connecting the reception pad 32*b* and the transmission pad 34 of the insulation substrate 10 (see the arrow and the chain line). That is, the area 30*d* corresponds to the side of the ring-shaped electrode 30 to which the section 30*a* illustrated in FIG. 6A belong. Among the multiple power supply lines 29, the two power supply lines 29*b* connected to the reception line 50*b* and the power supply lines 29*c* connected to the transmission line 52 overlap the area 30*d* of the ring-shaped electrode 30. As illustrated in FIG. 5, when the transmit signal is input, the transmission line 52 and the ring-shaped electrode 30 are electrostatically or magnetically coupled with each other. Therefore, the electric current flows in the ring-shaped electrode 30, and the magnetic field around the ring-shaped electrode 30 is thus generated. When the power supply line 29*c* overlaps the ring-shaped electrode 30 as illustrated in FIG. 4A, the distance between the power supply line 29*c* and the ring-shaped electrode 30 is short. Thus, the signal input to the transmission foot pad 62 further tends to be coupled with the ring-shaped electrode 30. The electric current generated by the coupling flows in the area 30*d* of the ring-shaped electrode 30 to generate the magnetic field around the other power supply line 29*b*. The generation of the magnetic field causes the electric current to flow in the power supply line 29*b*. As mentioned above, the power supply lines 29*b* and 29*c* overlap the ring-shaped electrode 30. This arrangement further increases the coupling between the transmission foot pad 62 and the reception foot pad 60*b* through the ring-shaped electrode 30. Thus, the isolation may deteriorate.

Figure 9A:
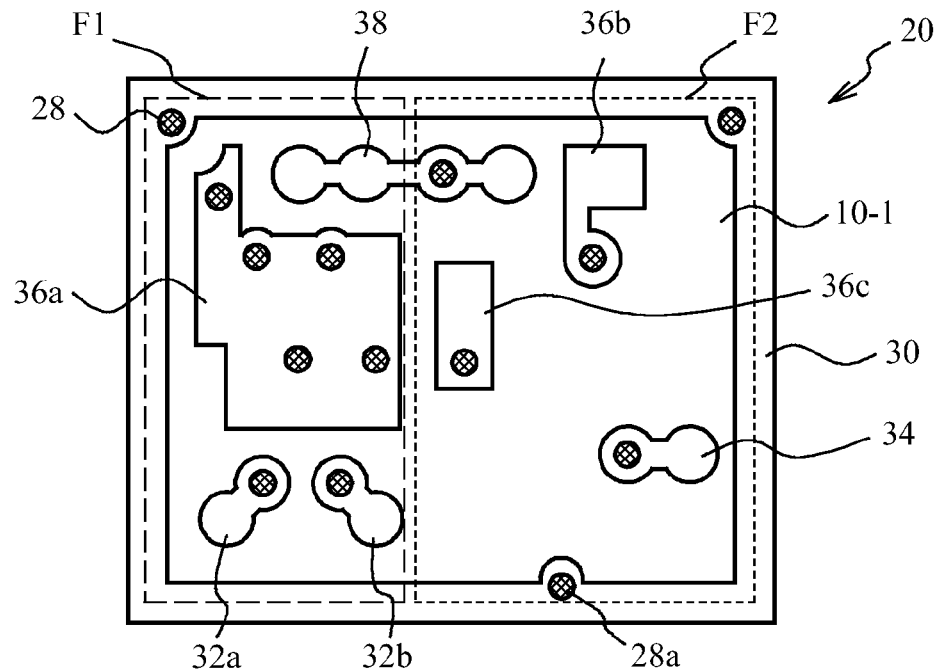
FIG. 9A is a plan view of the upper conductive layer of the insulation substrate provided in a duplexer according to a second embodiment.
Figure 9B:
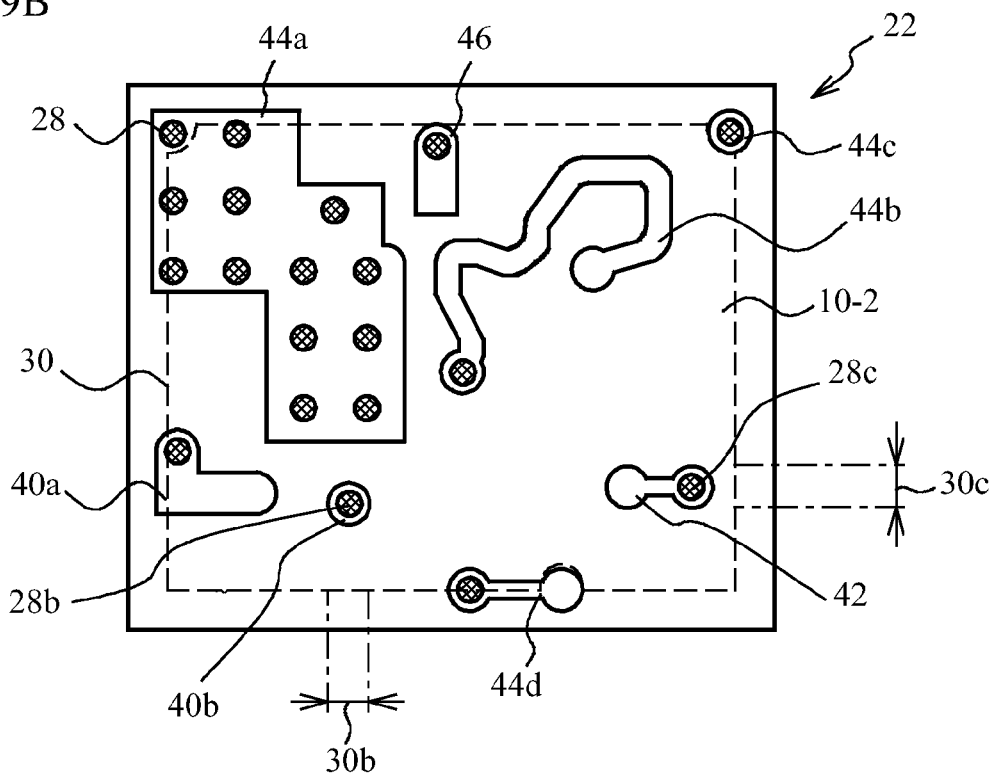
FIG. 9B is a plan view of the first inner conductive layer within the insulation substrate provided in the duplexer according to the second embodiment.
Figure 10:
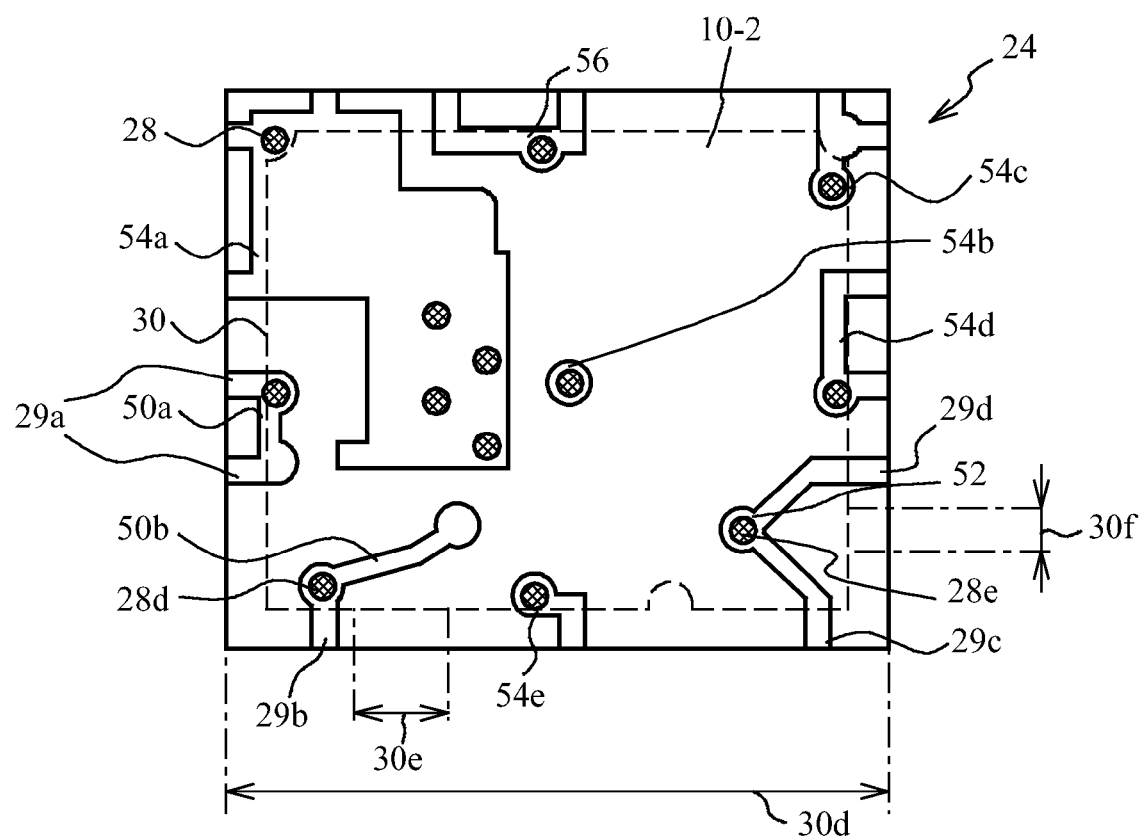
FIG. 10 is a plan view of the second inner conductive layer within the insulation substrate provided in the duplexer according to the second embodiment.

The second embodiment has changed structures of the first inner conductive layer 22 and the second inner conductive layer 24. FIG. 9A is a plan view of the upper conductive layer of the insulation substrate provided in a duplexer according to the second embodiment. FIG. 9B is a plan view of the first inner conductive layer in the insulation substrate provided in the duplexer according to the second embodiment. FIG. 10 is a plan view of the second inner conductive layer in the insulation substrate provided in the duplexer according to the second embodiment. The foot pad layer 26 is the same as the layer 26 illustrated in FIG. 4B. Explanation of the components described with reference to FIG. 3A to 4B is omitted.

As illustrated in FIG. 9A, the position of the transmission pad 34 is changed as compared with one illustrated in FIG. 6A. Except the transmission pad 34, the upper conductive layer 20 is the same as the embodiment illustrated in FIG. 6A.

As illustrated in FIG. 9B, the reception line 40b is connected to the via interconnection 28b and does not have any part extending in the planer direction of the insulation substrate 10. Thus, when the insulation substrate 10 is viewed from its top surface, the reception line 40b is not parallel to the portion 30b of the ring-shaped electrode 30. The reception line 40b and the via interconnection 28b do not overlap the ring-shaped electrode 30. The transmission line 42 has a part extending in the right and left directions in the drawing. The portion 30c that is the closest to the transmission line 42 of the ring-shaped electrode 30 is located at the right side of the transmission line 42. Thus, the transmission line 42 is not parallel to the portion 30c of the ring-shaped electrode 30. Also, the transmission line 42 is connected to the via interconnection 28c. When the insulation substrate 10 is viewed from its top face, the transmission line 42 and the via interconnection 28c do not overlap the ring-shaped electrode 30.

As illustrated in FIG. 10, the reception line 50b is connected to the via interconnection 28d, and the transmission line 52 is connected to the via interconnection 28e. The reception line 50b is not parallel to a portion 30e of the ring-shaped electrode 30, which is the closest to the reception line 50b (see the arrow and the chain line in the drawing). When the insulation substrate 10 is viewed from its top face, the reception line 50b does not overlap the ring-shaped electrode 30. Also, the transmission line 52 is not parallel to a portion 30f of the ring-shaped electrode 30, which is the closest to the transmission line 52 (see the arrow and the chain line in the drawing). When the insulation substrate 10 is viewed from its top face, the transmission line 52 does not overlap the ring-shaped electrode 30. The via interconnections 28d and 28e do not overlap the ring-shaped electrode 30. On the other hand, the power supply line 29b connected to the reception line 50b overlaps the ring-shaped electrode 30. The power supply lines 29c and 29d connected to the transmission line 52 overlap the ring-shaped electrode 30. However, the power supply lines 29b, 29c and 29d are used for supplying power in the electrolytic plating as described above, and are not involved in making a connect between the reception pad 32b and the reception foot pad 60b or between the transmission pad 34 and the transmission foot pad 62. That is, the power supply lines 29b, 29c and 29d are not lines for carrying reception signals or transmission signals. Thus, the influence of the power supply lines on the isolation is reduced.

The power supply lines 29b and 29c overlap the area 30d of the ring-shaped electrode 30. Thus, there is only one power supply line 29b that is connected to the reception line 50b and overlaps the area 30d. Also, there is only one power supply line 29c that is connected to the transmission line 42 and overlaps the area 30d. Additionally, the power supply line 29d is connected to the transmission line 42 and overlaps the area 30d. Two power supply lines 29a are connected to the reception line 40a, but does not overlap the area 30d. As illustrated in FIGS. 9A to 10, the duplexer according to the second embodiment is the same as the duplexer according to the first embodiment except the changed positions of the interconnections and the via interconnections.

Next, a description will be given of a simulation in which the isolation of the duplexer according to the second embodiment was calculated. In the simulation, each of signals output from the reception terminals Rx1 and Rx2 (corresponding to the reception foot pads 60a and 60b in FIG. 4B) was calculated when a signal was input from the transmission terminal Tx (corresponding to the transmission foot pad 62 in FIG. 4B). A filter having a combination of an SAW resonator and a DMS filter was used as the reception filter F1. A ladder type SAW filter was used as the transmission filter F2. A package of the duplexer had a size of 2.0×1.6 mm and a depth of 0.55 mm. The passband of the reception filter F1 was set equal to the reception band of W-CDMA Band 1, and the passband of the transmission filter F2 was set equal to the transmission band of W-CDMA Band 1. Calculation results in the first and second embodiments were compared with each other. Additionally, as mentioned above, the first inner conductive layer 22 and the second inner conductive layer 24 in the first embodiment were the same as them illustrated in FIGS. 3B and 4A except that the via interconnection 28a and the ground line 44d are provided.

Figure 11A:
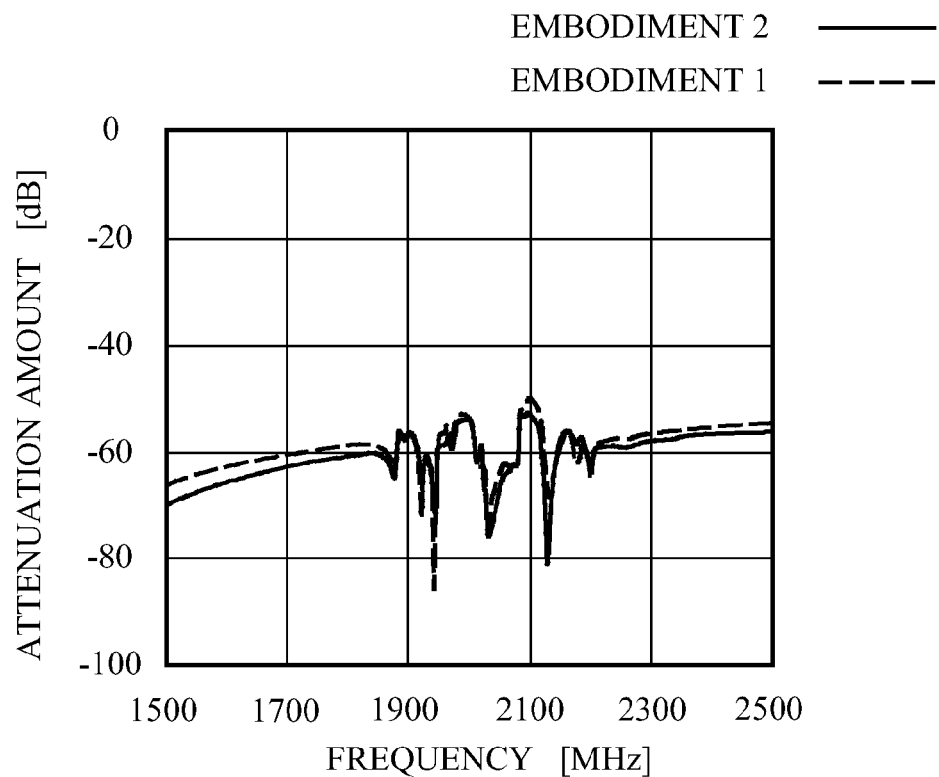
FIGS. 11A and 11B illustrate calculation results of the isolation of the duplexer according to the second embodiment.
Figure 11B:
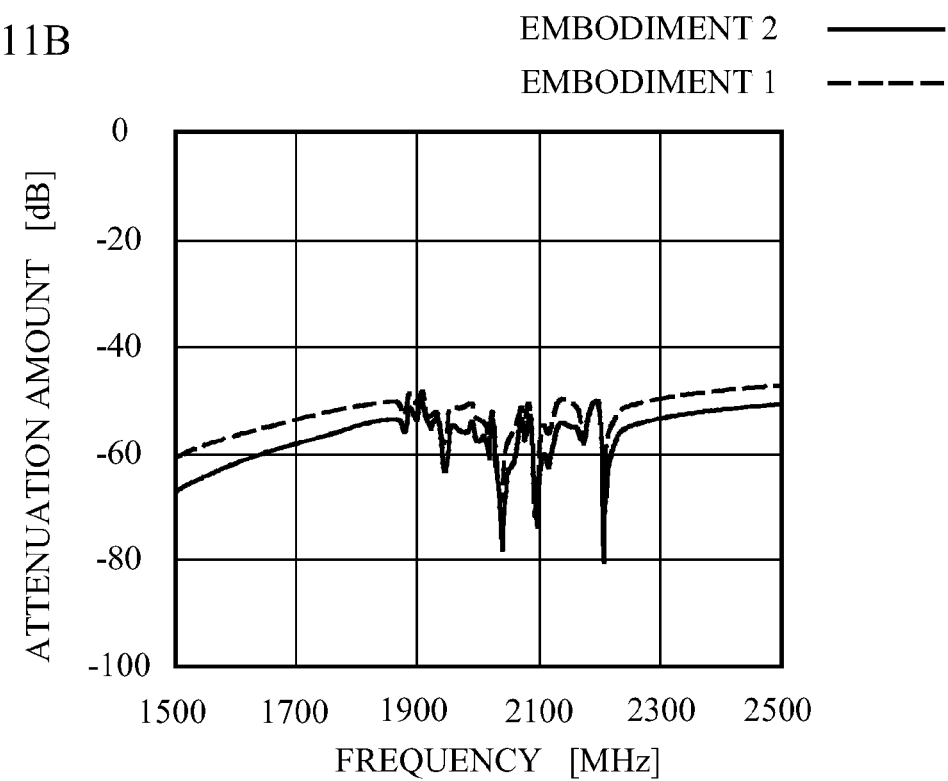

FIGS. 11A and 11B illustrate the calculation results of the isolation of the duplexer according to the second embodiment. FIG. 11A illustrates the calculation results of the signal output from the reception foot pad 60a. FIG. 11B illustrates the calculation results of the signal output from the reception foot pad 60b. The horizontal axis represents the frequency, and the vertical axis represents the attenuation amount. A solid line represents the calculation results of the duplexer according to the second embodiment, and a broken line represents the duplexer according to the first embodiment.

As illustrated in FIG. 11A, the signal in the second embodiment was more suppressed than that of the first embodiment. The suppression of the signal means that the isolation between the transmission foot pad 62 and the reception foot pad 60a was improved.

As illustrated in FIG. 11B, the signal in the second embodiment was more greatly suppressed than that of the first embodiment. Particularly, the signal was greatly suppressed at the frequency band from 1920 to 1980 MHz, which corresponds to the reception band of W-CDMA Band 1. Moreover, the signal was suppressed within a wide frequency band, as compared with the results of FIG. 11A.

According to the second embodiment, each of the four lines composed of the reception lines 40b and 50b and the transmission lines 42 and 52 is not parallel to the portions of the ring-shaped electrode 30 that are the closest to the four lines. This arrangement makes it difficult for the electric current caused by the magnetic field generated around the ring-shaped electrode 30 to flow in the reception lines 40b and 50b and the transmission lines 42 and 52. This difficulty suppresses the couplings between the electric current flowing in the ring-shaped electrode 30 and the reception lines 40b and 50b and the transmission lines 42 and 52. It is thus possible to realize the high isolation between the reception foot pads 60a and 60b and the transmission foot pad 62.

As illustrated in FIGS. 9B and 10, the reception lines 40b and 50b and the transmission lines 42 and 52 do not overlap the ring-shaped electrode 30. This arrangement increases the distances between the ring-shaped electrode 30 and the reception lines 40b and 50b and the transmission lines 42 and 52. The increased distances make it difficult for the reception lines 40b and 50b and the transmission line 42 and 52 to receive the influence of the magnetic field. It is thus possible to suppress the couplings between the electric current flowing in the ring-shaped electrode 30 and the reception lines 40b and 50b and the transmission lines 42 and 52 and to realize high isolation. When the insulation substrate 10 is viewed from its top face, the via interconnections 28b, 28c, 28d, and 28e do not overlap the ring-shaped electrode 30. This arrangement suppresses the couplings between the electric current flowing in the ring-shaped electrode 30 and the via interconnections 28b, 28c, 28d, and 28e, and realizes high isolation.

As described above, the power supply lines 29b, 29c, and 29d have less influence on the isolation than the reception lines 40b and 50b and the transmission lines 42 and 52. However, the isolation may be influenced by the coupling between the power supply line 29 and the electric current flowing in the ring-shaped electrode 30. As illustrated in FIG. 10 in the second embodiment, there is only one power supply line 29b that is connected to the reception line 50b and overlaps the area 30d. There is only one power supply line 29c that is connected to the transmission line 52 and overlaps the area 30d. In other words, there is only one power supply line 29b that is connected to the reception pad 32b and overlaps the area 30d. In other words, there is only one power supply line 29c that is connected to the transmission pad 34 and overlaps the area 30d. Thus, the coupling between the power supply lines 29b and 29c is more suppressed than, for example, the case where the two power supply lines 29b and the power supply line 29c overlap the area 30d as illustrated in FIG. 4A. This realizes high isolation more effectively.

As described with reference to FIG. 5, the magnetic field is stronger as closer to the transmission pad 34. Thus, the reception pad 32b close to the transmission pad 34 tends to be influenced by the magnetic field. The second embodiment has changed positions of the reception lines 40b and 50b and the via interconnections 28b and 28d connected to the reception pads 32b, and the power supply line 29c. This improves the isolation more effectively.

Additionally, the reception lines 40a and 50a connected to the reception pad 32a may not be parallel to the portions of the ring-shaped electrode 30 that are the closest thereto. The reception lines 40a and 50a may not overlap the ring-shaped electrode 30. The via interconnection 28 connected to the reception lines 40a and 50a may not overlap the ring-shaped electrode 30. In such a way, the reception line 40a and 50a connected to the reception pad 32a, and the via interconnection 28 may be positionally changed. Also, the reception lines 40a and 50a, and the via interconnection 28 connected to the reception lines 40a and 50a may be positionally changed, while the reception lines 40b and 50b, and the via interconnections 28b and 28d may be not changed. That is, at least one of the reception line and the via interconnection which are connected to the reception pad 32a, and the reception line and the via interconnection which are connected to the reception pad 32b have only to be changed. It is, however, preferable to change the positions of the reception line and the via interconnection which are connected to the reception pad 32b closer to the transmission pad 34 in order to effectively obtain high isolation. Only one reception pad may be used. In this case, the reception line and the via interconnection connected to the only one reception pad has only to be positionally changed.

Also, the reception lines 40b and 50b and the via interconnections 28b and 28d may be positionally changed, while the transmission lines 42 and 52 and the via interconnections 28c and 28e may not be positionally changed. Further, the transmission lines 42 and 52 and the via interconnections 28c and 28e may be positionally changed, while the reception lines 40b and 50b, and the via interconnections 28b and 28d may not be changed. As described above, an interconnection (a reception line or a transmission line) electrically connected to at least one of the reception pads 32a and 32b and the transmission pad 34 may not be parallel to the portion of the ring-shaped electrode 30 that is the closest to the above interconnection. Further, the interconnection electrically connected to at least one of the reception pads 32a and 32b and the transmission pad 34 may not overlap the ring-shaped electrode 30. Furthermore, a via interconnection electrically connected to at least one of the reception pads 32a and 32b and the transmission pad 34 may not overlap the ring-shaped electrode 30.

The single power supply line 29b connected to the reception line 50b may overlap the area 30d, and the power supply line 29c connected to the transmission line 52 may not overlap the area 30d. The power supply line 29c may overlap the area 30d, and the power supply line 29b may not overlap the area 30d. Thus, one of the single power supply line 29b connected to the reception line 50b and the single power supply line 29b connected to the transmission line 52 may overlap the area 30d, and the other thereof may not overlap the area 30d. In other words, the single power supply line is electrically connected to the reception pad 32b or the transmission pad 34 and overlap the area 30d. The upper conductive layer 20 illustrated in FIG. 3A may be used instead of the layer 20 illustrated in FIG. 9A. It is, however, preferable to use the upper conductive layer 20 having the via interconnection 28a in order to effectively obtain high isolation.

Third Embodiment

A third embodiment has an exemplary structure in which the power supply lines are positionally changed. Firstly, a description will be given of the deterioration of the isolation caused by the coupling between the power supply lines with reference to FIG. 4A.

As mentioned above, the multiple power supply lines may be coupled with each other through the ring-shaped electrode 30. As illustrated in FIG. 4A, the power supply line 29b connected to the reception line 50b, and the power supply line 29c connected to the transmission line 52 reach an edge of the side 10b (the lower side in the drawing) of the insulation substrate 10. Thus, the power supply lines 29b and 29c tend to be coupled with each other through the ring-shaped electrode 30. Thus, the isolation may deteriorate.

Figure 12:
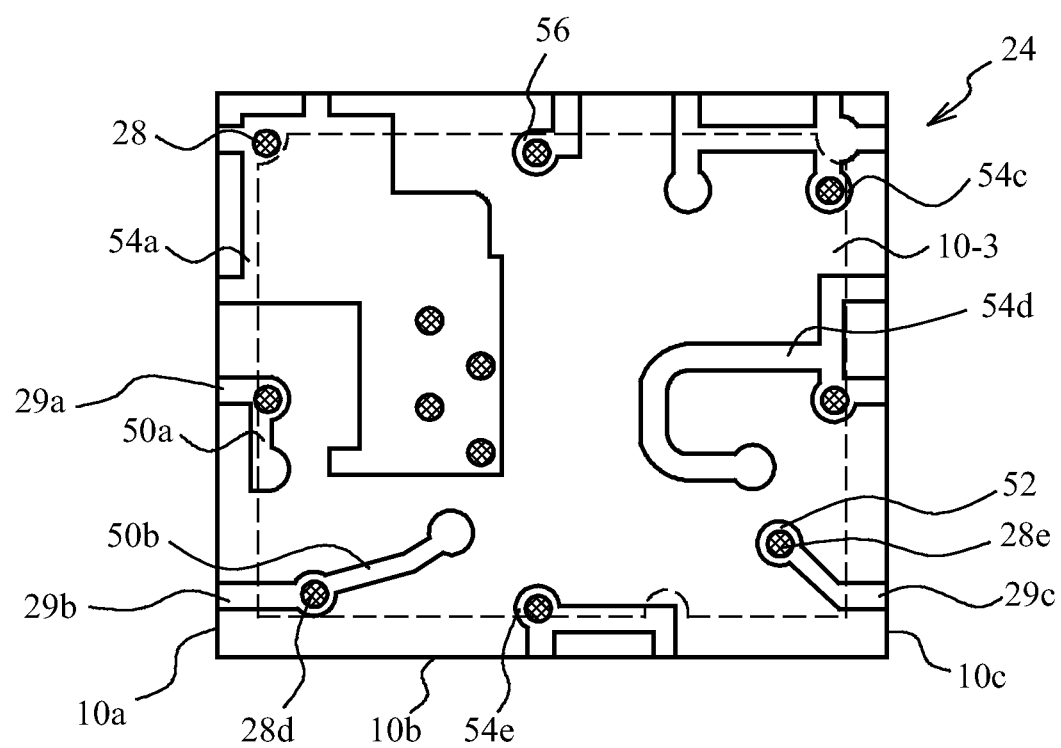
FIG. 12 is a plan view of the second inner conductive layer within the insulation substrate provided in the duplexer according to a third embodiment.

Next, a duplexer according to the third embodiment will be described. FIG. 12 is a plan view of the second inner conductive layer within the insulation substrate provided in the duplexer according to the third embodiment. The upper conductive layer 20 is the same as, for example, the layer 20 illustrated in FIG. 9A. The first inner conductive layer 22 is the same as, for example, the layer 22 illustrated in FIG. 9B. The foot pad layer 26 is the same as, for example, the layer 26 illustrated in FIG. 4B. Additionally, the structures of the ground lines 54c and 54d and the antenna line 56 are different from those illustrated in FIG. 4A. However, the structures of the ground lines 54c and 54d and the antenna line 56 may be the same as, for example, those illustrated in FIG. 4A.

As illustrated in FIG. 12, the power supply lines 29a and 29b reach an edge of the side 10a (the left side in the drawing) of the insulation substrate 10. The power supply line 29c reaches an edge of the side 10c (the right side in the drawing) of the insulation substrate 10. The power supply wrings 29a and 29b respectively connected to the reception lines 50a and 50b, and the power supply line 29c connected to the transmission line 52 reach the different edges of the sides of the insulation substrate 10, respectively. This arrangement increases the distance between the power supply line 29a and the power supply line 29c and the distance between the power supply line 29b and the power supply line 29c. It is thus possible to realize high isolation between the reception foot pads 60a and 60b and the transmission foot pad 62.

The power supply lines 29a and 29b may reach the edge of the side 10a of the insulation substrate 10, and the power supply line 29c may reach the edge of the side 10b. It is, however, preferable that the distance between the power supply lines should be great in order to obtain high isolation. Thus, it is preferable the power supply lines 29a and 29b and the power supply line 29c should reach the edges of the sides 10a and 10c of the insulation substrate 10. The power supply lines reach the edges of the different sides of the insulation substrate 10, even when the single reception line is provided. Although the upper conductive layer 20 illustrated in FIG. 6A is used, for example, the layer 20 illustrated in FIG. 3A may be used. It is, however, preferable to use the upper conductive layer 20 illustrated in FIG. 6A in order to effectively obtain high isolation.

Fourth Embodiment

A fourth embodiment has an exemplary structure in which a plating layer is formed by electroless plating. The upper conductive layer 20 and the foot pad layer 26 each include the plating layer as a protective layer as mentioned above. When the electrolytic plating is used to form the plating layer, the power supply line 29 is used for supplying the power (for example, see FIG. 4B). The power supply line 29 overlaps the ring-shaped electrode 30, since reaching the edge of the insulation substrate 10. Thus, the power supply line 29 and the electric current flowing the ring-shaped electrode 30 may be coupled with each other, whereby the isolation deteriorates.

Figure 13:
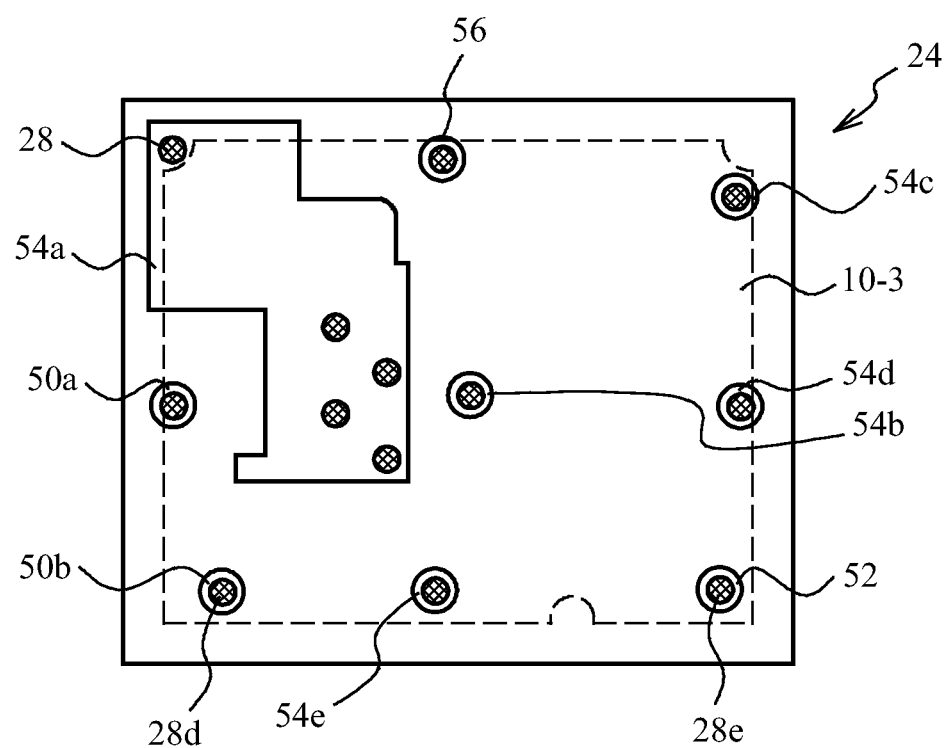
FIG. 13 is a plan view of the second inner conductive layer within the insulation substrate provided in the duplexer according to a fourth embodiment.

In the fourth embodiment, the plating layer is provided by electroless plating. FIG. 13 is a plan view of the second inner conductive layer within the insulation substrate provided in the duplexer according to the fourth embodiment. The upper conductive layer 20 is the same as, for example, the layer 20 illustrated in FIG. 9A. The first inner conductive layer 22 is the same as, for example, the layer 22 illustrated in FIG. 9B. The foot pad layer 26 is the same as, for example, the layer 26 illustrated in FIG. 4B.

As illustrated in FIG. 13, the power supply line is not included in the second inner conductive layer 24. In other words, between the second layer 10-2 and the third layer 10-3, there is no conductor which is connected to the reception lines 50a and 50b or the transmission line 52 and which overlaps the ring-shaped electrode 30. Further, the power supply line is not included in the upper conductive layer 20, the first inner conductive layer 22, and the foot pad layer 26 (see FIGS. 3A, 3B, and 4B).

In the fourth embodiment, the upper conductive layer 20 and the foot pad layer 26 each include the plating layer, which is formed by electroless plating. For this reason, it is unnecessary to provide the power supply line overlapping the ring-shaped electrode 30. Thus, this suppresses the coupling between the power supply line and the electric current flowing in the ring-shaped electrode 30, thereby ensuring the high isolation between the reception foot pads 60a and 60b and the transmission foot pad 62.

The upper conductive layer 20 illustrated in FIG. 6A is used, but, for example, the layer 20 illustrated in FIG. 3A may be used. It is, however, preferable to use the upper conductive layer 20 illustrated in FIG. 6A in order to more effectively obtain high isolation. The second inner conductive layer 24 illustrated in FIG. 4A or 10, from which the power supply lines are removed, may be used instead of the second inner conductive layer 24 illustrated in FIG. 13. It is preferable to positionally change the reception line 50a, the transmission line 52, and the via interconnections 28d and 28e as illustrated in FIG. 10 in order to effectively obtain high isolation.

Fifth Embodiment

Figure 14A:
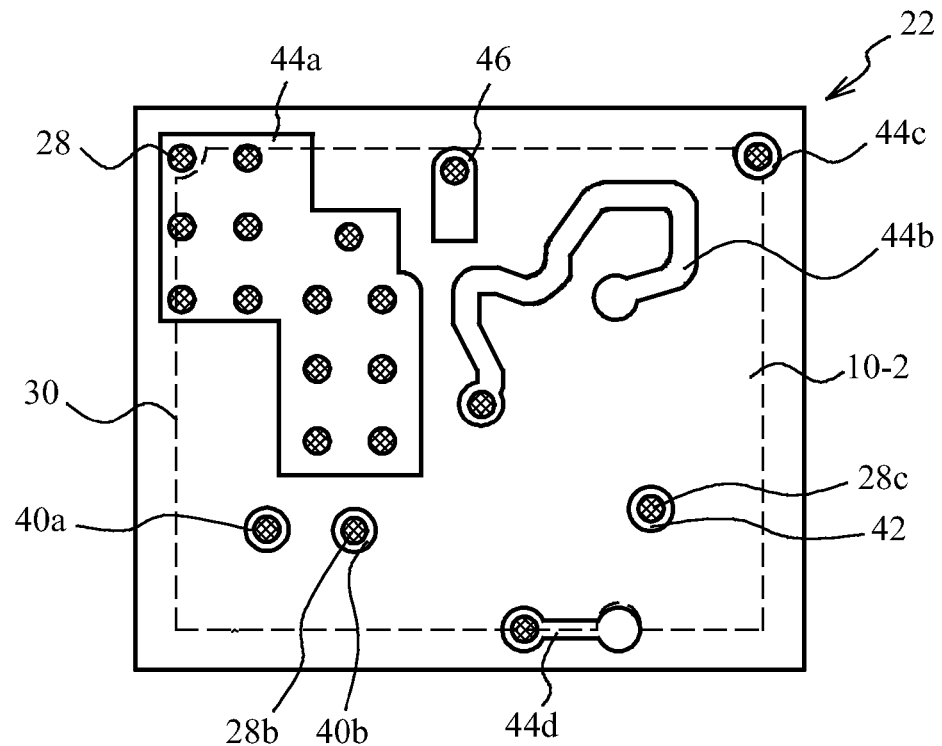
FIG. 14A is a plan view of the first inner conductive layer of the insulation substrate provided in the duplexer according to a fifth embodiment.
Figure 14B:
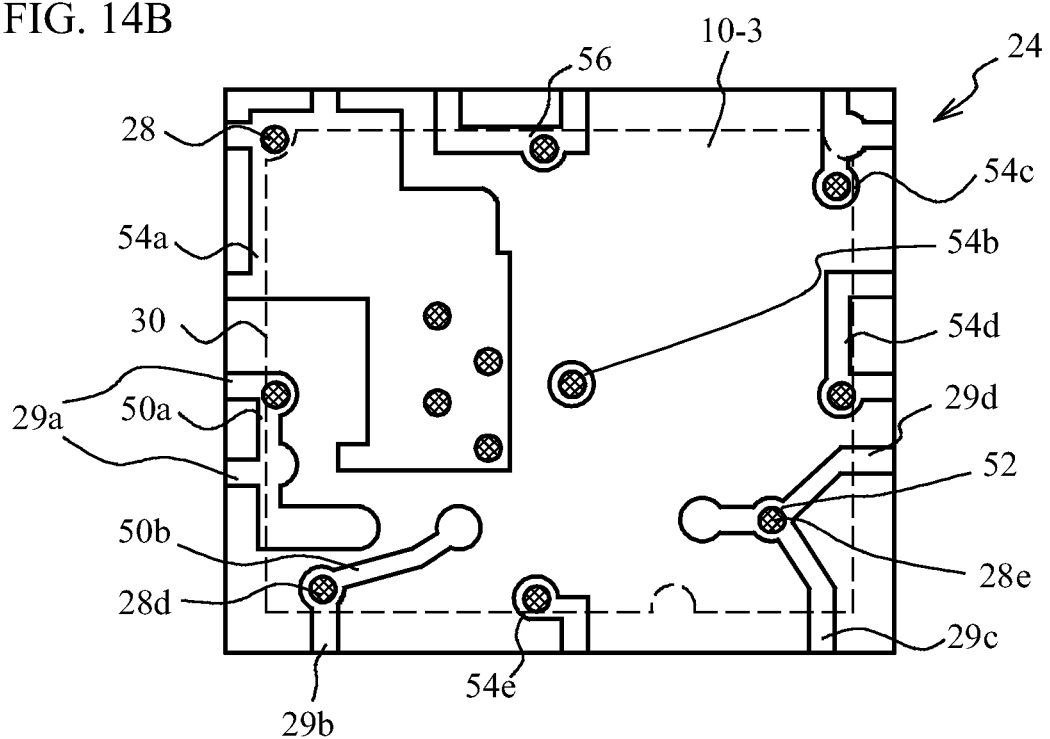
FIG. 14B is a plan view of the second inner conductive layer within the insulation substrate provided in the duplexer according to the fifth embodiment.

A fifth embodiment has an exemplary structure in which the distance between conductors is changed. FIG. 14A is a plan view of the first inner conductive layer within the insulation substrate provided in a duplexer according to the fifth embodiment. FIG. 14B is a plan view of the second inner conductive layer within the insulation substrate provided in the duplexer according to the fifth embodiment. The upper conductive layer 20 is the same as, for example, the layer 20 illustrated in FIG. 9A. The foot pad layer 26 is the same as, for example, the layer 26 illustrated in FIG. 4B.

As illustrated in FIG. 14A, each line (another line) of the reception lines 40a and 40b included in the first inner conductive layer 22 (another conductive layer), and the transmission line 42 is an interconnection for being connected to the via interconnection 28, and does not have a portion extending in the planer direction of the insulation substrate 10.

As illustrated in FIG. 14B, each (line) of the reception lines 50a and 50b included in the second inner conductive layer 24 (inner conductive layer), and the transmission line 52 has a portion extending in the planer direction of the insulation substrate 10. Thus, the reception line 50a is longer than the reception line 40a. The reception line 50b is longer than the reception line 40b. The transmission line 52 is longer than the transmission line 42. In this way, the second inner conductive layer 24 is a conductor including the longest reception line among the reception lines, and the longest transmission line among the transmission lines.

Figure 15:
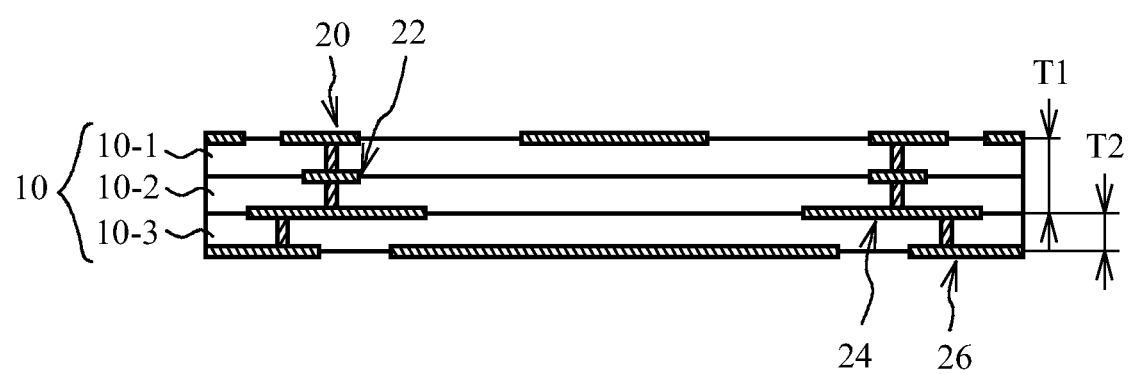
FIG. 15 is a sectional view of the insulation substrate provided in the duplexer according to the fifth embodiment.

FIG. 15 is a sectional view of the insulation substrate provided in the duplexer according to the fifth embodiment. As illustrated in FIG. 15, a thickness T1 of the insulation substrate 10 between the second inner conductive layer 24 and the upper surface of the insulation substrate 10 is greater than a thickness T2 of the insulation substrate 10 between the second inner conductive layer 24 and the lower surface of the insulation substrate 10. In other words, in the thickness direction of the insulation substrate 10, the distance between the second inner conductive layer 24 and the upper conductive layer 20 is greater than the distance between the second inner conductive layer 24 and the foot pad layer 26. The distance between the ring-shaped electrode 30 and each of the reception lines 50a and 50b and the transmission line 52 is great. Thus, the fifth embodiment has a difficulty in coupling of the electric current flowing in the ring-shaped electrode 30 with the reception lines 50a and 50b and the transmission line 52. It is thus possible to realize high isolation between the reception foot pads 60a and 60b and the transmission foot pad 62.

The line has a longer portion exposed to the magnetic field as the line is longer, and is influenced by the magnetic field more easily. The reception lines 50a and 50b and the transmission line 52 included in the second inner conductive layer 24 are longer than the reception lines 40a and 40b and the transmission line 42 included in the first inner conductive layer 22, and are influenced by the magnetic field more easily. The reception lines 50a and 50b and the transmission line 52 tend to be coupled with the electric current flowing in the ring-shaped electrode 30. In the fifth embodiment, the distance between the second inner conductive layer 24 including the long line and the ring-shaped electrode 30 is great. Thus, high isolation is realized more effectively.

When the first inner conductive layer 22 includes the longest reception line among the reception lines, and the longest transmission line among the transmission lines, the thickness of the insulation substrate 10 between the first inner conductive layer 22 and the upper surface of the insulation substrate 10 is set greater than the thickness of the insulation substrate 10 between the first inner conductive layer 22 and the lower surface of the insulation substrate 10. For example, the first inner conductive layer 22 includes one of the longest transmission line and the longest reception line, and the second inner conductive layer 24 includes the other. In this case, the thickness of the insulation substrate 10 between the first inner conductive layer 22 and the upper surface of the insulation substrate 10 is set larger than the thickness of the insulation substrate 10 between the first inner conductive layer 22 and the lower surface of the insulation substrate 10. Further, the thickness of the insulation substrate 10 between the second inner conductive layer 24 and the upper surface of the insulation substrate 10 is set greater than the thickness of the insulation substrate 10 between the second inner conductive layer 24 and the lower surface of the insulation substrate 10. Even if three inner conductive layers are provided, the same configuration may be employed as described above. Furthermore, in cases where only one inner conductive layer is provided, the thickness of the insulation substrate 10 between the single inner conductive layer and the upper surface of the insulation substrate 10 is set greater than the thickness between the inner conductive layer 22 and the lower surface of the insulation substrate 10.

The upper conductive layer 20 illustrated in FIG. 6A may be replaced with, for example, the layer 20 illustrated in FIG. 3A. It is, however, preferable to use the upper conductive layer 20 illustrated in FIG. 6A in order to more effectively obtain high isolation. Like the second embodiment, the second inner conductive layer 24 has the changed positions of the interconnections, the via interconnections and the power supply lines. The fifth embodiment is not limited to the above arrangements but may have the second inner conductive layer 24 illustrated in FIG. 4A. It is, however, preferable to employ the second inner conductive layer 24 illustrated in FIG. 14B in order to effectively obtain high isolation.

Sixth Embodiment

Figure 16A:
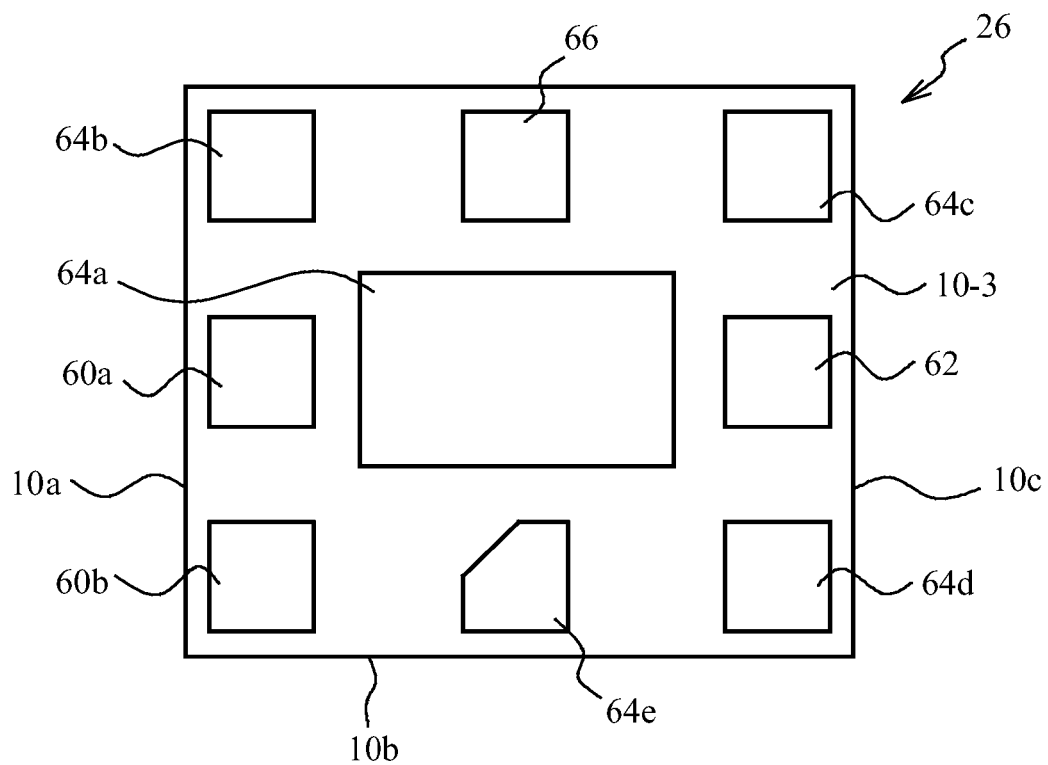
FIG. 16A is a plan view of the lower conductive layer of the insulation substrate provided in the duplexer according to a sixth embodiment.
Figure 16B:
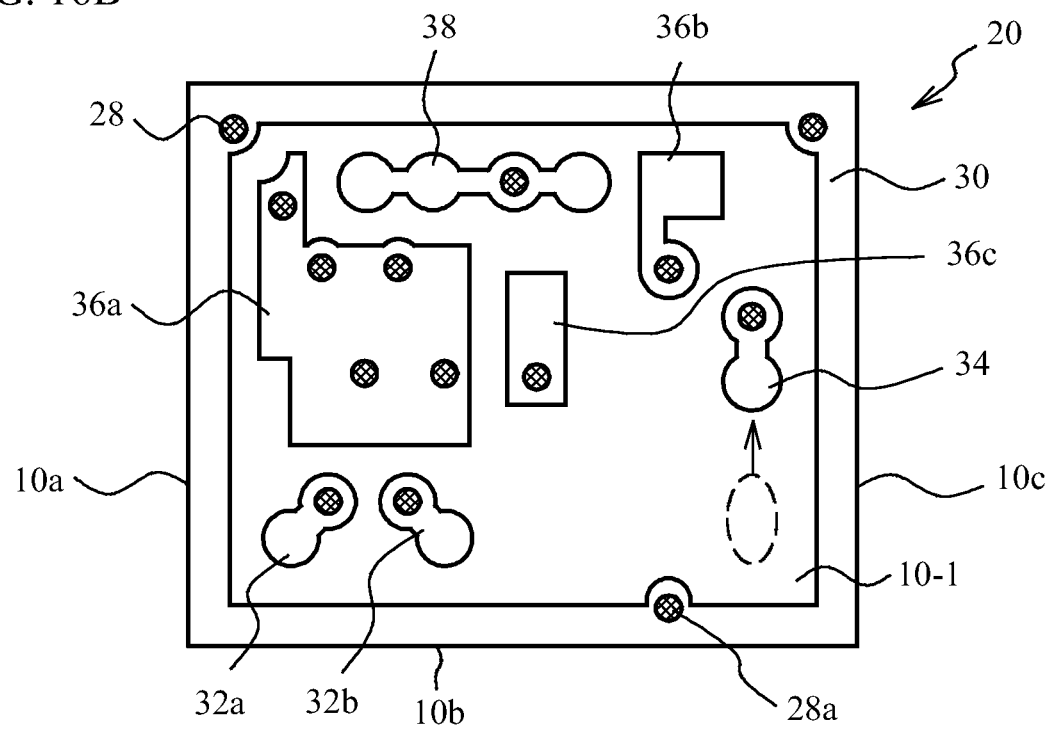
FIG. 16B is a plan view of the upper conductive layer of the insulation substrate provided in the duplexer according to the sixth embodiment.

A sixth embodiment has an exemplary structure having a changed position of the foot pad. FIG. 16A is a plan view of the lower conductive layer of the insulation substrate provided in a duplexer according to the sixth embodiment. FIG. 16B is a plan view of the upper conductive layer of the insulation substrate provided in the duplexer according to the sixth embodiment.

As illustrated in FIG. 16A, the reception foot pad 60a provided in the foot pad layer 26 is provided along the side 10a of the insulation substrate 10. The reception foot pad 60b is provided around the corner where the sides 10a and 10b of the insulation substrate 10 cross each other. The transmission foot pad 62 is provided along the side 10c of the insulation substrate 10. The position of the transmission foot pad 62 illustrated in FIG. 4B is changed into the position around the center of the side 10c. Thus, the reception foot pads 60a and 60b and the transmission foot pad 62 are provided along the different sides. This arrangement increases the distances between the reception foot pads 60a and 60b and the transmission foot pad 62.

As illustrated in FIG. 16B, the position of the transmission pad 34 provided in the upper conductive layer 20 is also changed in accordance with the changed position of the transmission foot pad 62. Specifically, the position of the transmission pad 34 provided around the corner (the ellipse depicted by a broken line in FIG. 16B) where the side 10b and the side 10c cross each other in FIG. 6A is changed into the position around the center of the side 10c. This arrangement increases the distances between the reception pads 32a and 32b and the transmission pad 34, and realizes high isolation. Further, the ring-shaped electrode 30 is bent between the reception pads 32a and 32b and the transmission pad 34. The bent ring-shaped electrode 30 generates a loss of the electric current flowing in the ring-shaped electrode 30. It is thus possible to obtain high isolation between the reception foot pads 60a and 60b and the transmission foot pad 62.

Besides the arrangements illustrated in FIG. 16A, the reception foot pads 60a and 60b and the transmission foot pad 62 may be provided along different sides. In this case, it is preferable to have large distances between the reception foot pads 60a and 60b and the transmission foot pad 62 in order to realize high isolation. It is preferable that the reception foot pad 60a and the transmission foot pad 62 face each other across the ground foot pad 64a as illustrated in FIG. 16A. The transmission foot pad 62 may be provided at the position on a diagonal line connecting between the transmission foot pad 62 and the reception foot pad 60b (for example, the position of the ground foot pad 64c illustrated in FIG. 16B).

The upper conductive layer 20 illustrated in FIG. 6A may be replaced with, for example, the layer 20 illustrated in FIG. 3A. It is, however, preferable to use the upper conductive layer 20 illustrated in FIG. 6A in order to more effectively obtain high isolation. It is also possible to use either the second inner conductive layer 24 illustrated in FIG. 4A or 10. It is, however, preferable to use the second inner conductive layer 24 illustrated in FIG. 10 in order to effectively obtain high isolation.

Next, a description will be given of the position where the ring-shaped electrode 30 is provided. As described with reference to FIGS. 2B and 3A, the ring-shaped electrode 30 is used for sealing. For the sealing, the ring-shaped electrode 30 is required to surround the reception pads 32a and 32b, the transmission pad 34, the ground pads 36a, 36b and 36c, and the antenna pad 38. The ring-shaped electrode 30 may have another structure for surrounding.

Figure 17:
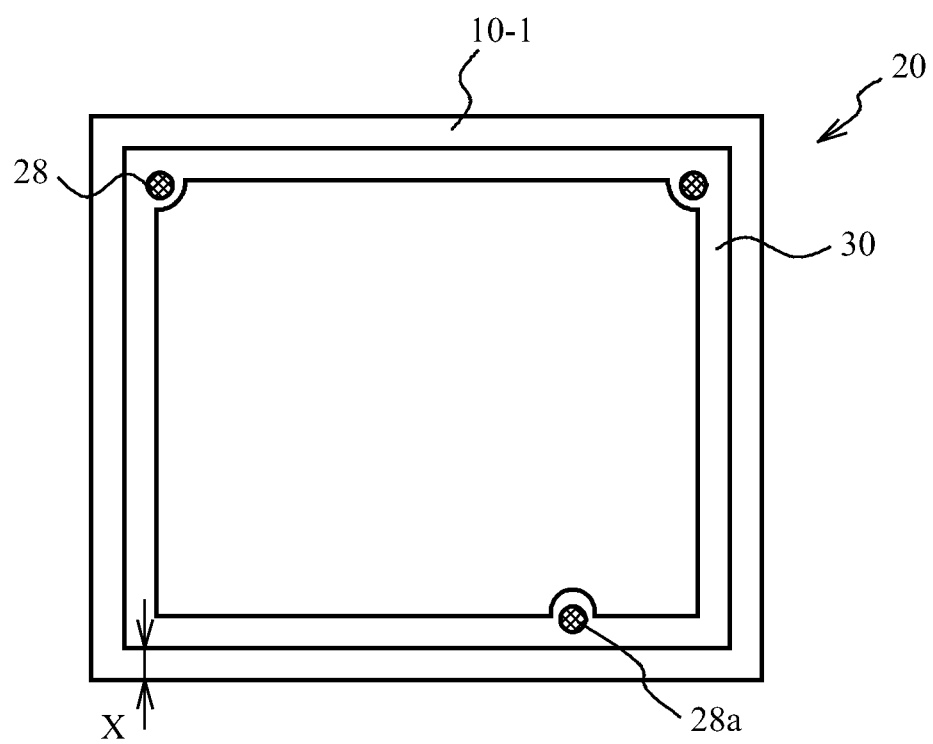
FIG. 17 is a plan view of the upper conductive layer of the insulation substrate having a ring-shaped electrode with another structure.

FIG. 17 is a plan view of the upper conductive layer of the insulation substrate having a ring-shaped electrode with another structure. For simplifying the drawing, the reception pads 32a and 32b, the transmission pad 34, the ground pads 36a, 36b and 36c, and the antenna pad 38 are omitted in the drawing.

As illustrated in FIG. 17, the ring-shaped electrode 30 is positioned in a distance X from the outer periphery of the insulation substrate 10. The ring-shaped electrode 30 surrounds the reception pads 32a and 32b, the transmission pad 34, the ground pads 36a, 36b and 36c, and the antenna pad 38. This enables the hermetic sealing. However, since the ring-shaped electrode 30 is not along the outer periphery of the insulation substrate 10, there is a space between the ring-shaped electrode 30 and the outer periphery of the insulation substrate 10. Such a space obstructs downsizing of the duplexer. It is preferable to provide the ring-shaped electrode 30 along the outer periphery of the insulation substrate 10 as illustrated in FIGS. 6A, 8, 9, and 16B in order to reduce the size of the duplexer. The ring-shaped electrode 30 is not limited to a continuous ring shape but may have another shape, which may have a cutout in the ring shape, for example.

The reception filter F1 and the transmission filter F2 may be SAW filters having an interdigital transducer formed on a piezoelectric insulation substrate, boundary acoustic wave filters, or filters using a piezoelectric film resonator (Film Bulk Acoustic Resonator: FBAR). The duplexer is not limited to W-CDMA Band 1 in the embodiments but may correspond to, for example, W-CDMA Band 2, Global System for Mobile Communication (GSM), or another communication type.

The embodiments of the present invention have been described. The present invention is not limited to these specific embodiments but may be varied or changed within the scope of the claimed invention.

What is claimed is:

1. A duplexer comprising:
an insulation substrate having an upper surface on which a transmission filter and a reception filter are mounted, and a lower surface on which a foot pad layer electrically connected to the transmission filter and the reception filter is formed;
a transmission pad provided on the upper surface and electrically connected to the transmission filter;
a reception pad provided on the upper surface and electrically connected to the reception filter;
a ring-shaped electrode provided on the upper surface and configured to surround the transmission pad and the reception pad;
a ground foot pad included in the foot pad layer, and
a via interconnection configured to electrically interconnect the ring-shaped electrode and the ground foot pad and to be provided in the ring-shaped electrode in a section along a shorter one of routes that connect the transmission pad and the reception pad to each other along the ring-shaped electrode.

2. The duplexer of claim 1, wherein the ring-shaped electrode has a first portion in which the via interconnection is provided and second portions other than the first portion, and said first portion is wider than the second portions.

3. The duplexer of claim 1, further comprising:
an upper conductive layer configured to be provided on the upper surface of the insulation substrate and include the transmission pad and the reception pad;
a plating layer formed by electrolytic plating and included in each of the upper conductive layer and the foot pad layer; and
a plurality of power supply lines configured to be provided within the insulation substrate and to extend up to an edge of the insulation substrate and configured to be electrically connected to the upper conductive layer and the foot pad layer and to be used for supplying power in the electrolytic plating,
wherein one of the plurality of the power supply lines is electrically connected to the transmission pad or the reception pad, and overlaps the ring-shaped electrode in the section along the shorter one of routes connecting the transmission pad and the reception pad to each other.

4. The duplexer of claim 1, wherein the ring-shaped electrode is provided along an outer periphery of the insulation substrate.

5. A duplexer comprising:
an insulation substrate having an upper surface on which an upper conductive layer, a transmission filter and a reception filter are provided, a lower surface on which a foot pad layer is provided, and an inner conductive layer;
a signal pad that is included in the upper conductive layer, and is electrically connected to at least one of the transmission filter and the reception filter;
a ring-shaped electrode that is included in the upper conductive layer and surrounds the signal pad;
a signal foot pad that is included in the foot pad layer and is electrically connected to at least one of the transmission filter and the reception filter through the signal pad; and
an interconnection that is included in the inner conductive layer and is electrically connected to the signal pad and the signal foot pad,
wherein the interconnection is not parallel to a portion of the ring-shaped electrode, the portion being the closest to the interconnection when the insulation substrate is viewed from the upper surface.

6. The duplexer of claim 5, wherein the interconnection does not overlap the ring-shaped electrode when the insulation substrate is viewed from the upper surface.

7. The duplexer of claim 5, further comprising a via interconnection that does not overlap the ring-shaped electrode when the insulation substrate is viewed from the upper surface, and is electrically connected to the interconnection.

8. The duplexer of claim 5, wherein:
the signal pad is a reception pad electrically connected to the reception filter; and
the signal foot pad is a reception foot pad.

9. The duplexer of claim 5, wherein:
the upper conductive layer includes a transmission pad electrically connected to the transmission filter, and a plurality of reception pads electrically connected to the reception filter; and
the signal pad is one of the plurality of the reception pads that is the closest to the transmission pad.

10. The duplexer of claim 5, wherein:
the signal pad is a transmission pad electrically connected to the transmission filter; and
the signal foot pad is a transmission foot pad.

11. The duplexer of claim 5, wherein:
the signal pad includes a transmission pad electrically connected to the transmission filter, and a reception pad electrically connected to the reception filter; and
the signal foot pad includes a transmission foot pad and a reception foot pad.

12. The duplexer of claim 5, wherein the upper conductive layer and the foot pad layer each include a plating layer formed by electroless plating.

13. The duplexer of claim 5, wherein:
the upper conductive layer and the foot pad layer each include a plating layer formed by electrolytic plating;
the upper conductive layer includes a transmission pad electrically connected to the transmission filter, and a reception pad electrically connected to the reception filter;
a power supply line configured to be included in the inner conductive layer and to extend up to an edge of the insulation substrate and configured to be electrically connected to the interconnection and to be used for supplying power in performing the electrolytic plating; and
the power supply line is connected to the interconnection, and overlaps a portion of the ring-shaped electrode that extends in a direction of a shorter one of routes connecting the transmission pad and the reception pad along the ring-shaped electrode.

14. The duplexer of claim 5, wherein:
the upper conductive layer and the foot pad layer each include a plating layer formed by electrolytic plating;
the upper conductive layer includes a transmission pad electrically connected to the transmission filter, and a reception pad electrically connected to the reception filter;

a plurality of power supply lines configured to be included in the inner conductive layer and to extend up to an edge of the insulation substrate and configured to be electrically connected to the interconnection and to be used for supplying power in the electrolytic plating; and one of the plurality of the power supply lines that is electrically connected to the transmission pad, and another one of the plurality of the power supply lines that is electrically connected to the reception pad arrive at different edges of the insulation substrate.

15. A duplexer comprising:

an insulation substrate having an upper surface on which an upper conductive layer, a transmission filter and a reception filter are provided, a lower surface on which a foot pad layer is provided, and an inner conductive layer;

a signal pad that is included in the upper conductive layer, and is electrically connected to at least one of the transmission filter and the reception filter;

a ring-shaped electrode that is included in the upper conductive layer and surrounds the signal pad;

a signal foot pad that is included in the foot pad layer and is electrically connected to at least one of the transmission filter and the reception filter through the signal pad; and an interconnection that is included in the inner conductive layer and is electrically connected to the signal pad and the signal foot pad, wherein a thickness of the insulation substrate between the inner conductive layer and the upper surface is greater than a thickness of the insulation substrate between the inner conductive layer and the lower surface.

16. The duplexer of claim 15, wherein:

the insulation substrate includes another inner conductive layer;

said another inner conductive layer includes another interconnection electrically connected to the signal pad and the signal foot pad; and the interconnection is longer than said another interconnection.

\* \* \* \* \*